(12) United States Patent
Kihara et al.

(10) Patent No.: US 8,865,010 B2
(45) Date of Patent: Oct. 21, 2014

(54) PATTERN FORMING METHOD AND IMPRINT MOLD MANUFACTURING METHOD

(71) Applicant: Kabushiki Kaisha Toshiba, Tokyo (JP)

(72) Inventors: Naoko Kihara, Kawasaki (JP); Hiroyuki Hieda, Yokohama (JP); Akiko Yuzawa, Kawasaki (JP); Norikatsu Sasao, Tokyo (JP); Ryosuke Yamamoto, Kawasaki (JP); Yoshiyuki Kamata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/750,086

(22) Filed: Jan. 25, 2013

(65) Prior Publication Data

US 2013/0256263 A1 Oct. 3, 2013

(30) Foreign Application Priority Data

Mar. 28, 2012 (JP) ................................. 2012-074879

(51) Int. Cl.
*B44C 1/22* (2006.01)
*G03F 7/00* (2006.01)
*G03F 7/16* (2006.01)
*B05D 3/10* (2006.01)
*G03F 7/40* (2006.01)
*G11B 5/855* (2006.01)
*G11B 5/74* (2006.01)
*B05D 1/18* (2006.01)

(52) U.S. Cl.
CPC .............. *B44C 1/227* (2013.01); *G03F 7/0002* (2013.01); *G03F 7/0017* (2013.01); *G03F 7/00* (2013.01); *G03F 7/168* (2013.01); *B05D 3/108* (2013.01); *G03F 7/405* (2013.01); *B05D 1/185* (2013.01); *G11B 5/855* (2013.01); *G11B 5/746* (2013.01)
USPC ..................... 216/41; 216/11; 216/22; 216/56

(58) Field of Classification Search
CPC combination set(s) only.
See application file for complete search history.

(56) References Cited

U.S. PATENT DOCUMENTS

| 7,767,265 B2 | 8/2010 | Yoshida et al. |
| 2009/0239103 A1 | 9/2009 | Hasegawa et al. |
| 2011/0096436 A1* | 4/2011 | Albrecht et al. ............. 360/135 |

FOREIGN PATENT DOCUMENTS

| JP | 2004-342226 | 12/2004 | |
| JP | 2007-138052 | 6/2007 | |
| JP | 2007-313568 | 12/2007 | |
| WO | WO2011116223 | * 9/2011 | .............. H01L 51/40 |
| WO | WO2011128120 | * 10/2011 | ................ G03F 7/00 |

OTHER PUBLICATIONS

Naito, K. et al., "2.5-Inch Disk Patterned Media Prepared by an Artificially Assisted Self-Assembling Method", IEEE Transactions on Magnetics, vol. 38, No. 5, (Sep. 2002), pp. 1949-1951.

* cited by examiner

*Primary Examiner* — Lan Vinh
*Assistant Examiner* — Jiong-Ping Lu
(74) *Attorney, Agent, or Firm* — Nixon & Vanderhye, P.C.

(57) ABSTRACT

In one embodiment, a pattern forming method includes: forming a functional layer having a functional group to cross-link a first polymer on a substrate; forming a diblock copolymer layer having the first polymer and a second polymer on the functional layer; self-assembling the diblock copolymer layer to form a self-assembled layer, the self-assembled layer having a first domain corresponding to the first polymer, and a plurality of second domains corresponding to the second polymer and surrounded by or interposed in the first domain; cross-linking the first polymer in the self-assembled layer with the functional group in the functional layer to form a bonding layer disposed in the self-assembled layer and bonded to the functional layer; and washing or etching the self-assembled layer to remain the bonding layer.

12 Claims, 19 Drawing Sheets

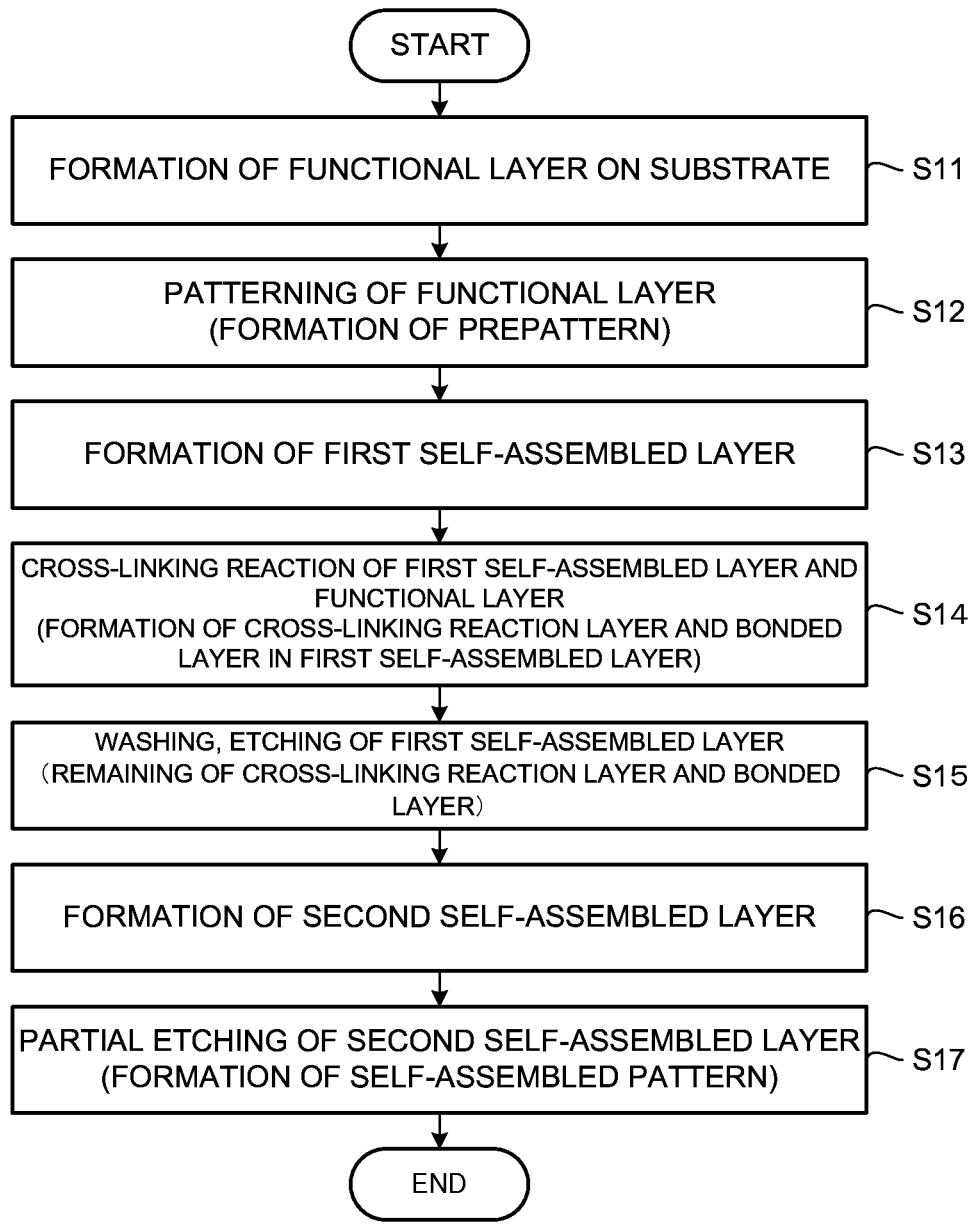

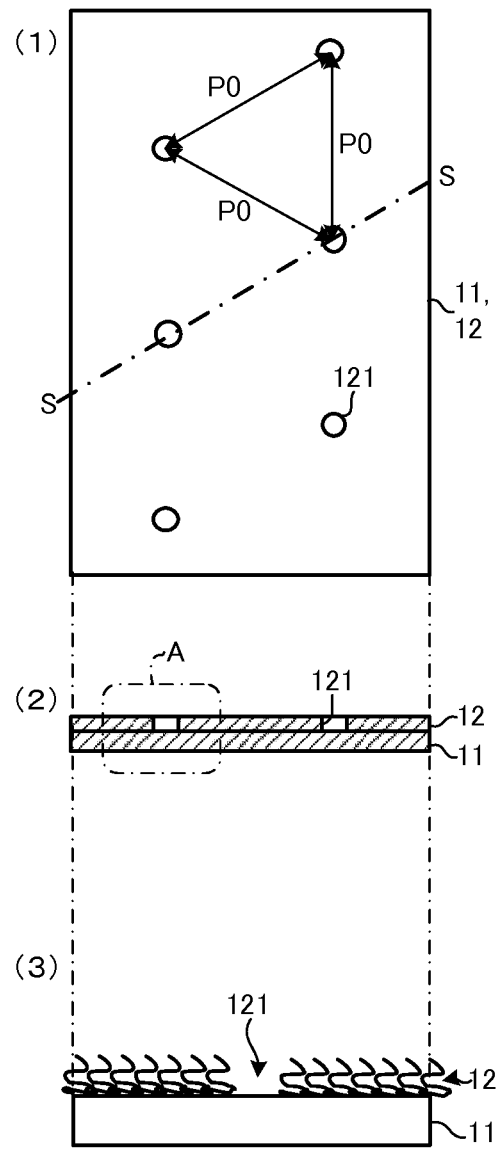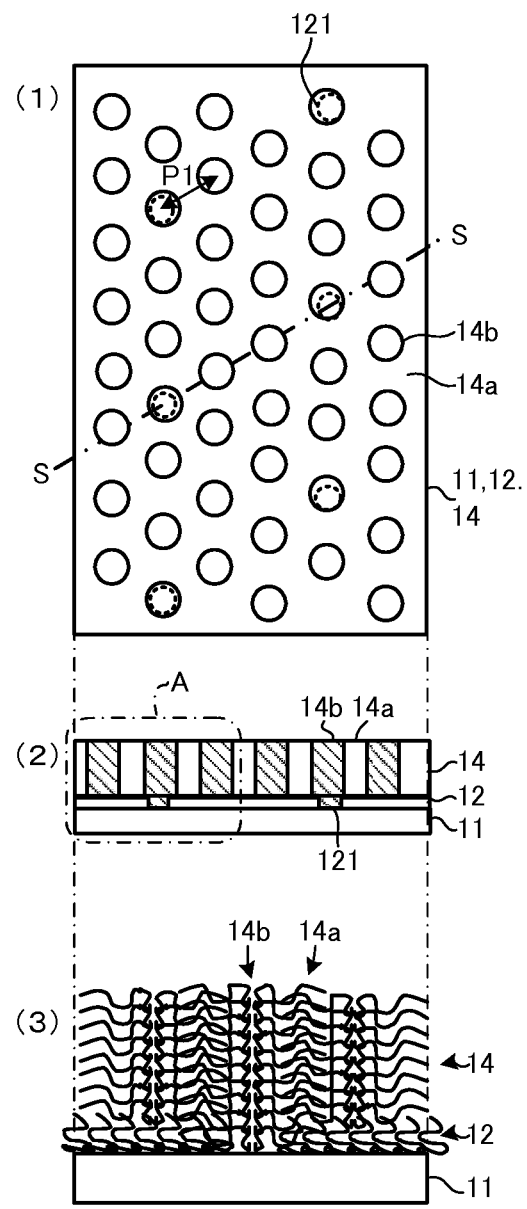

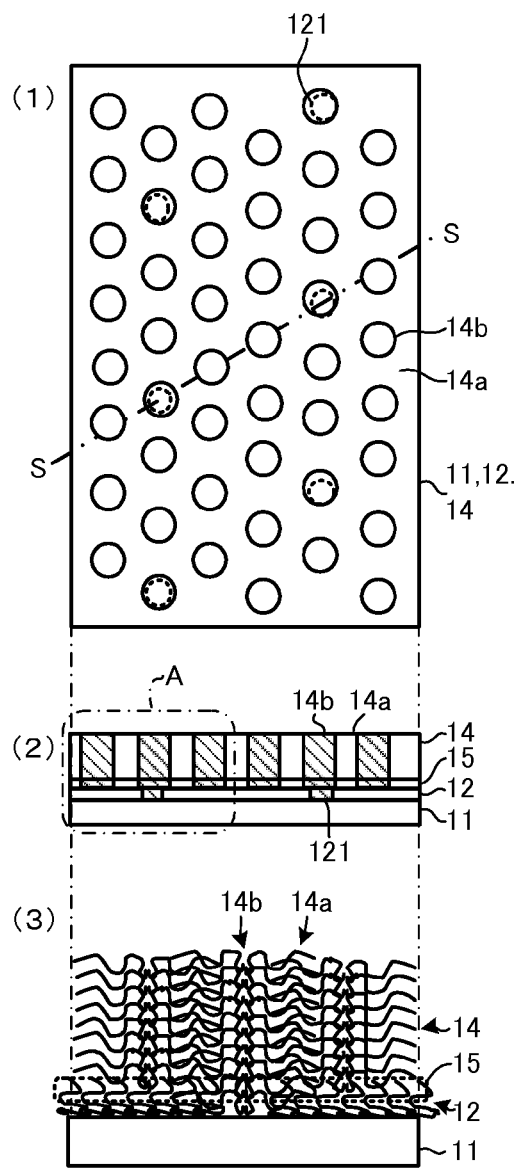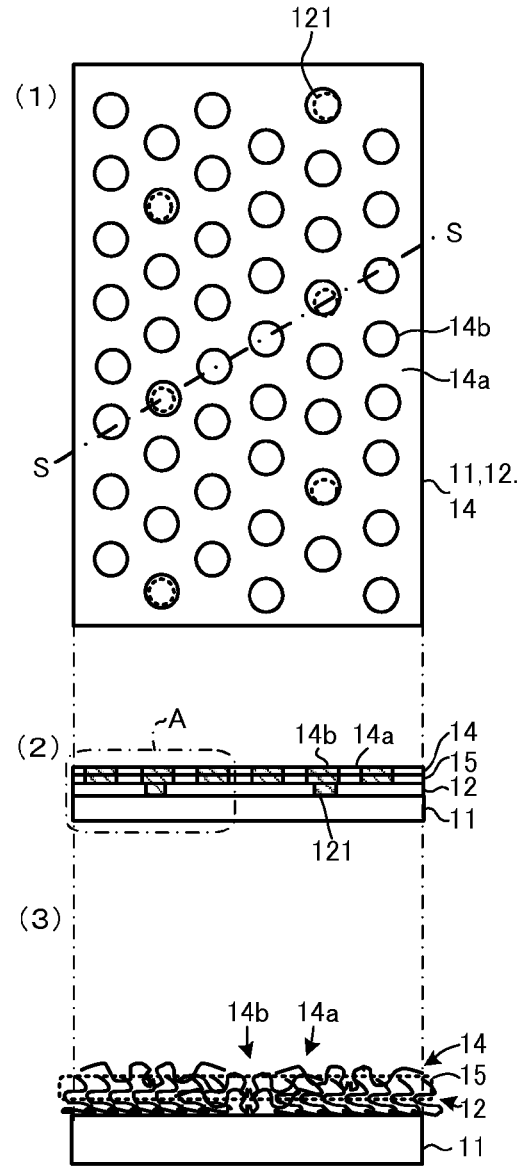

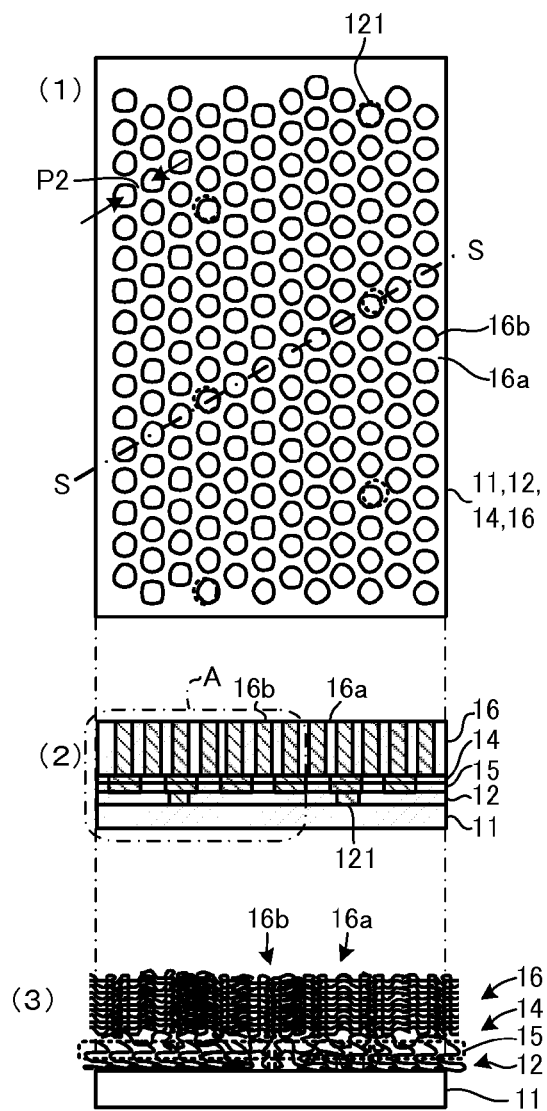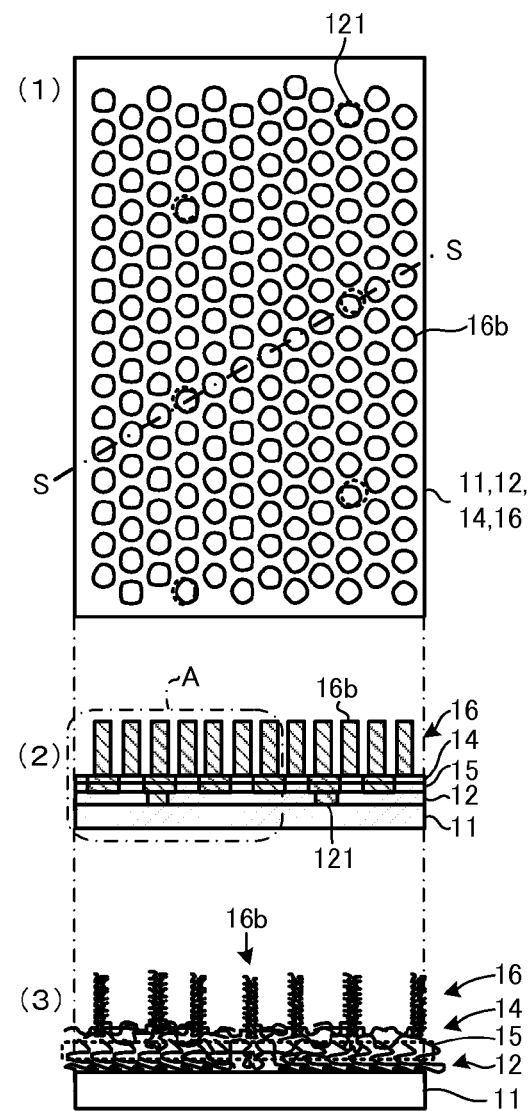

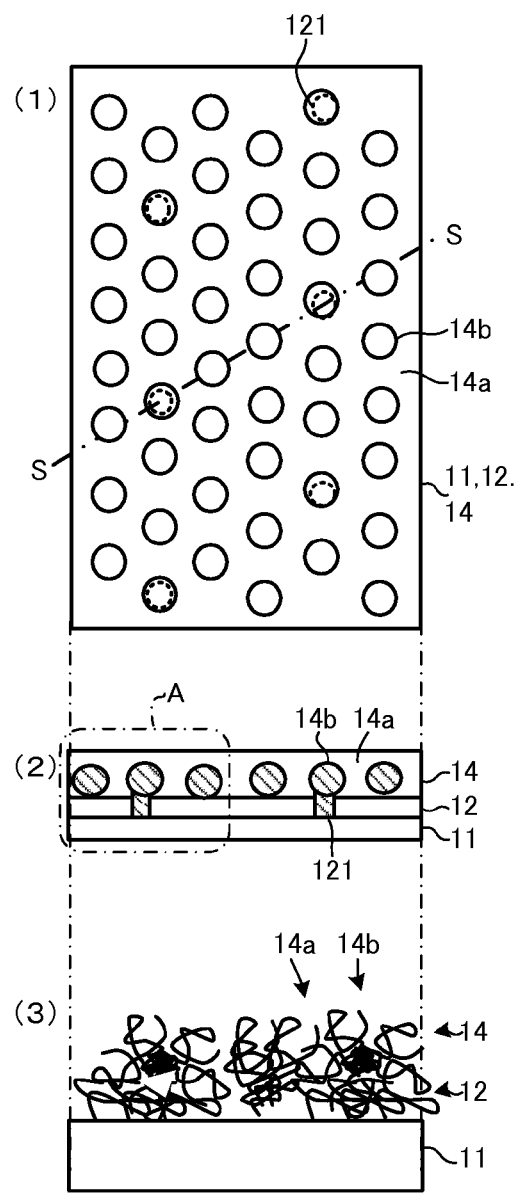
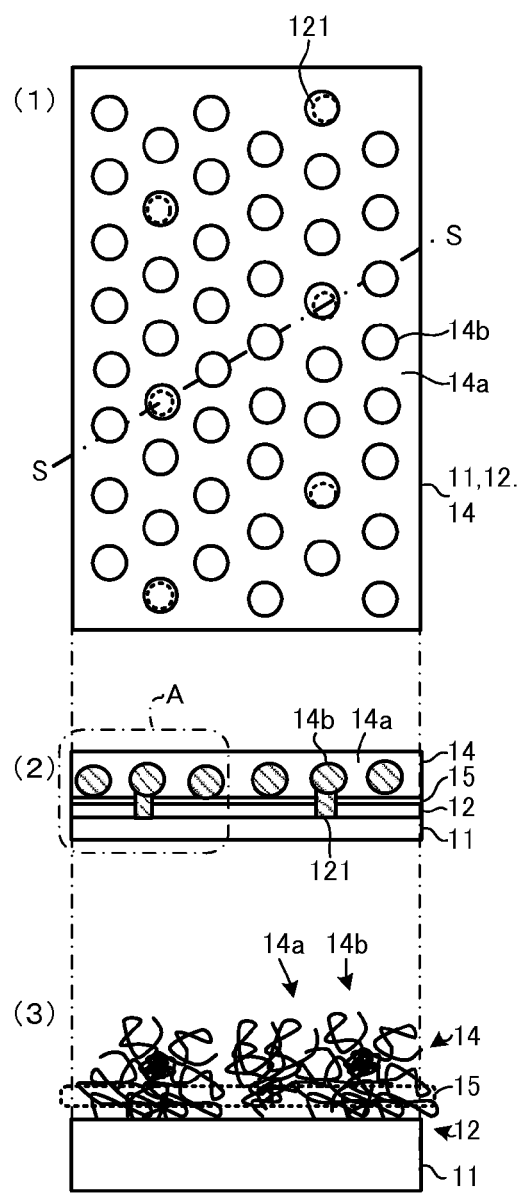

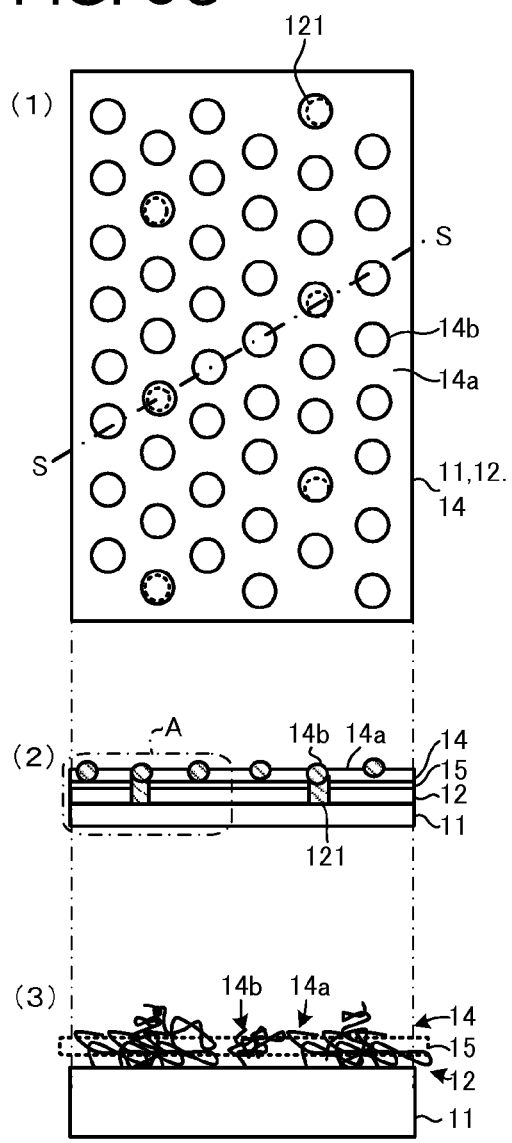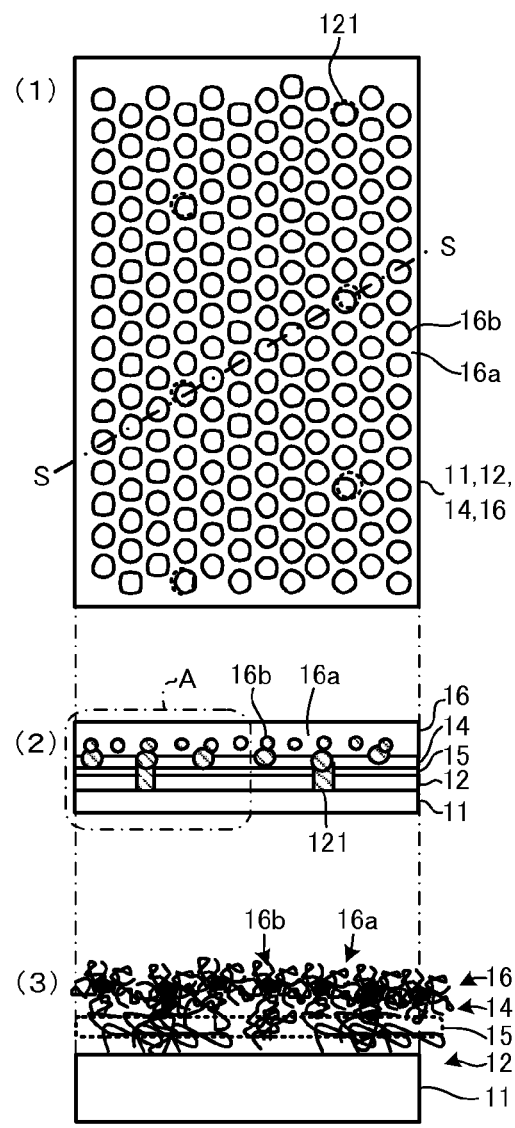

FIG. 5E
FIG. 5F
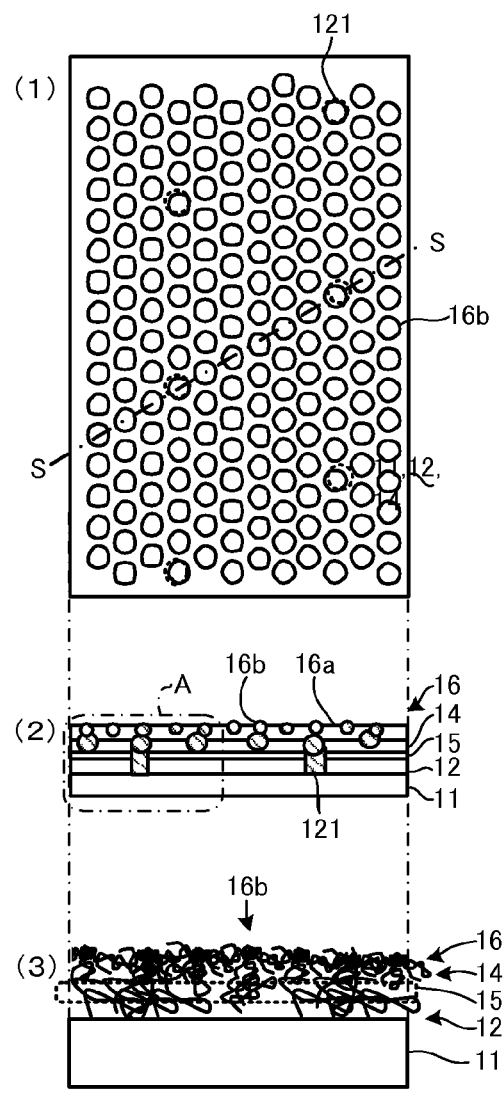
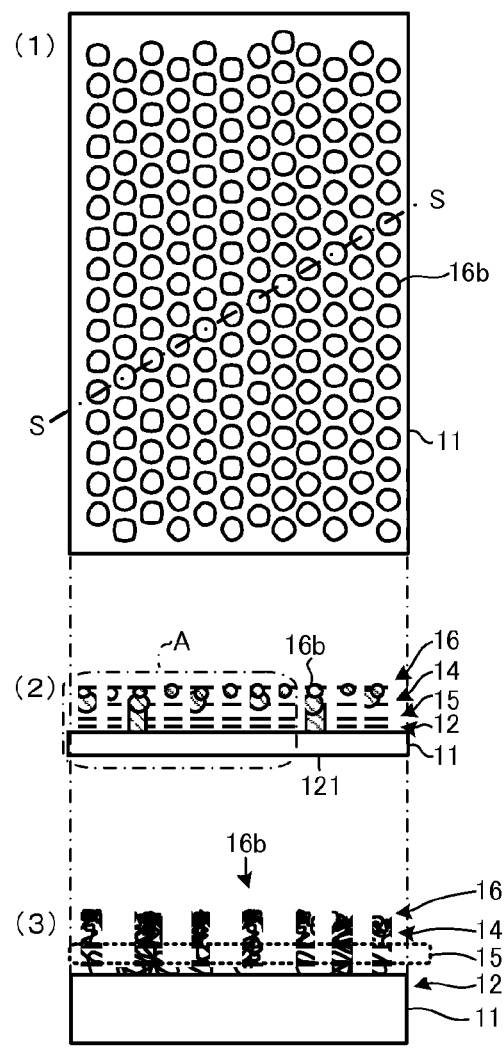

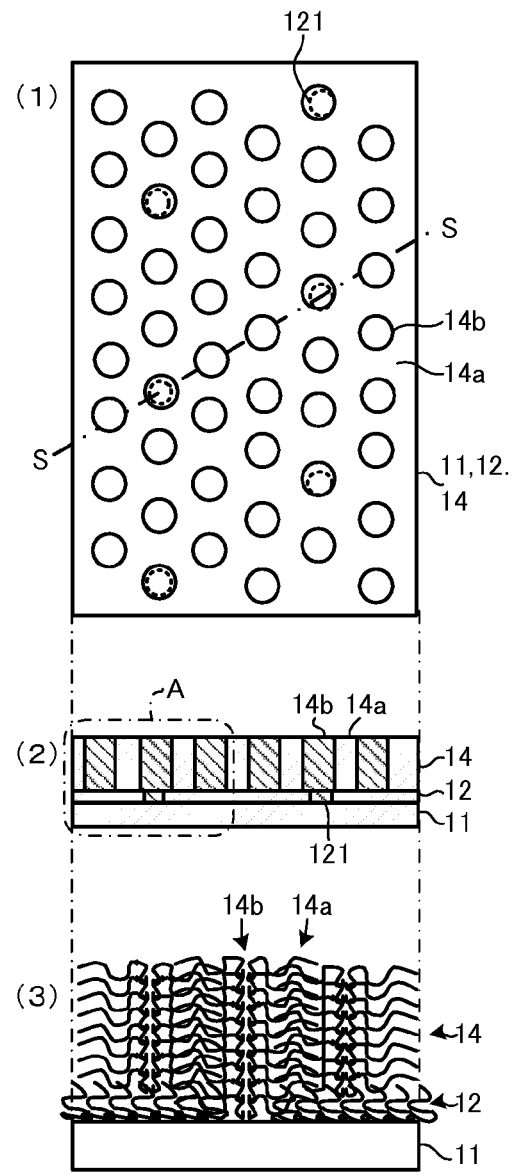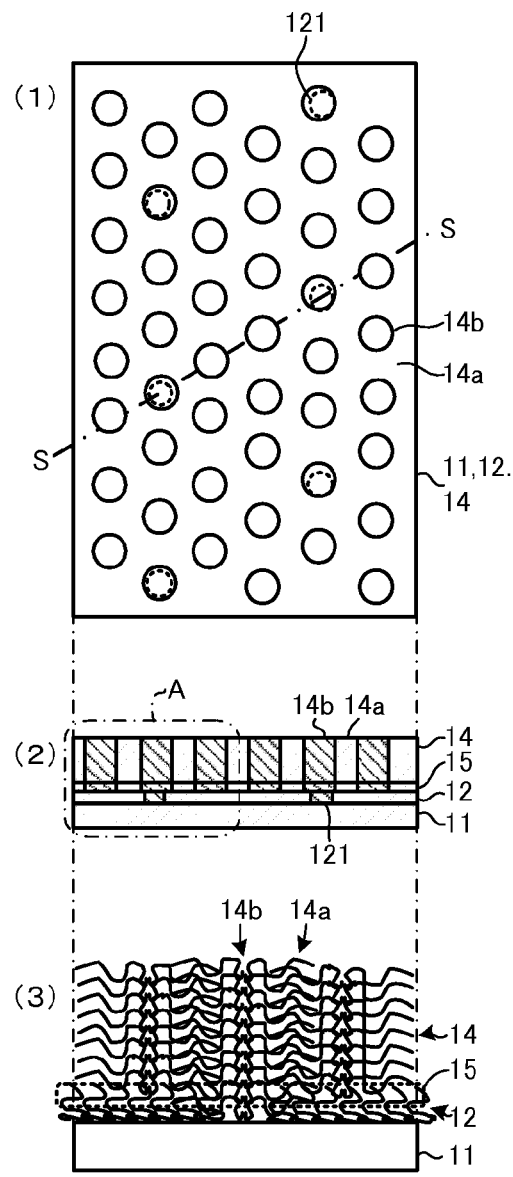

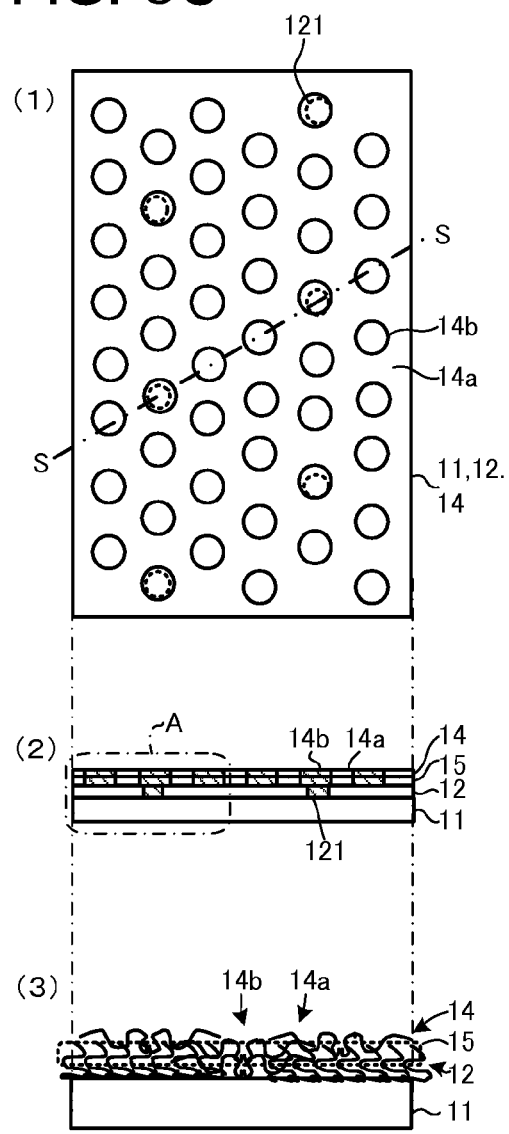
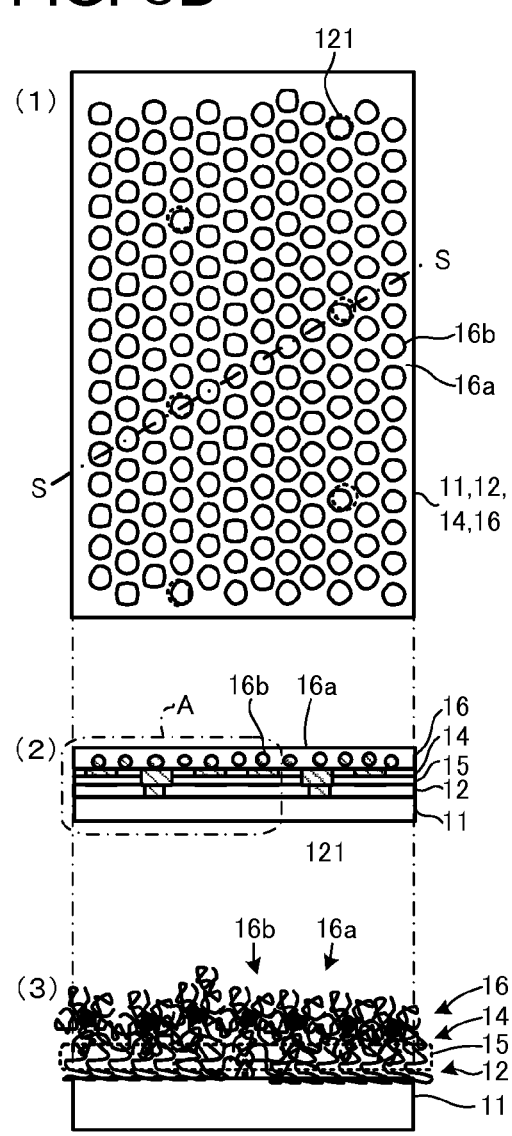

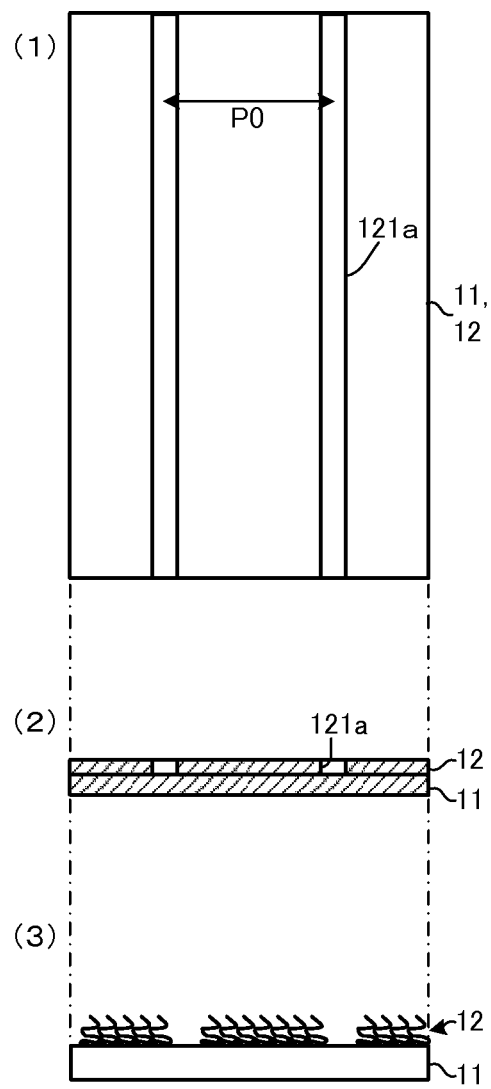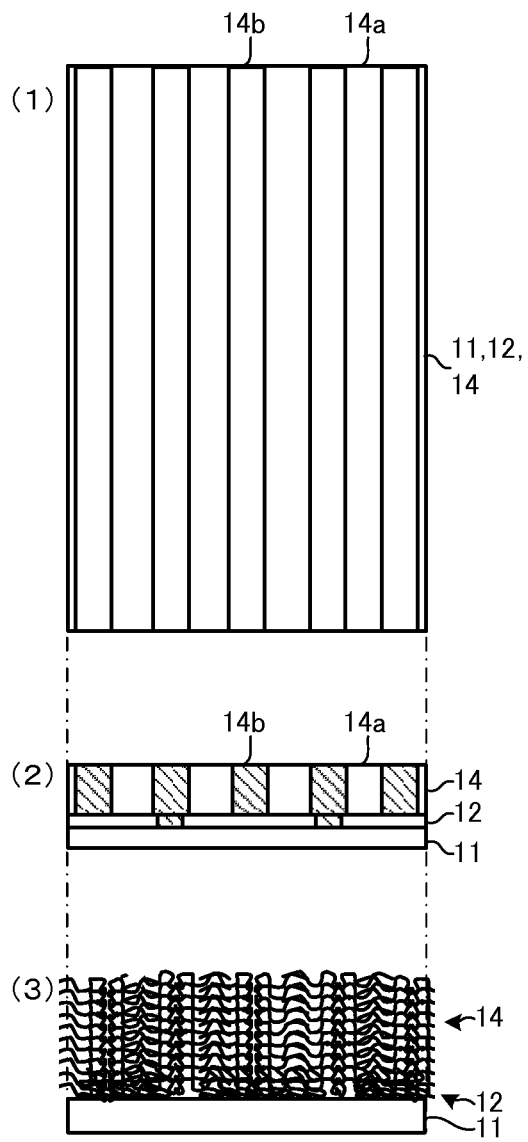

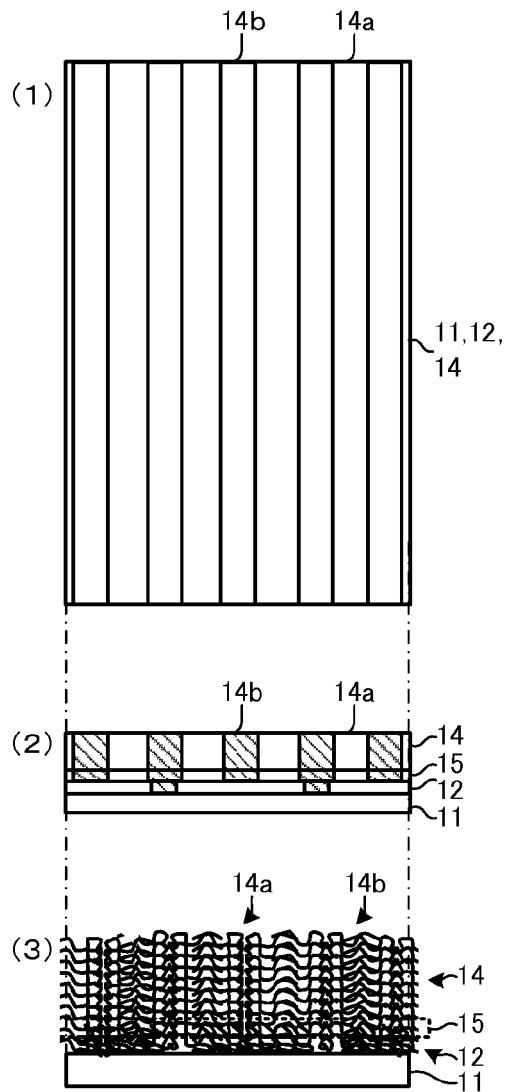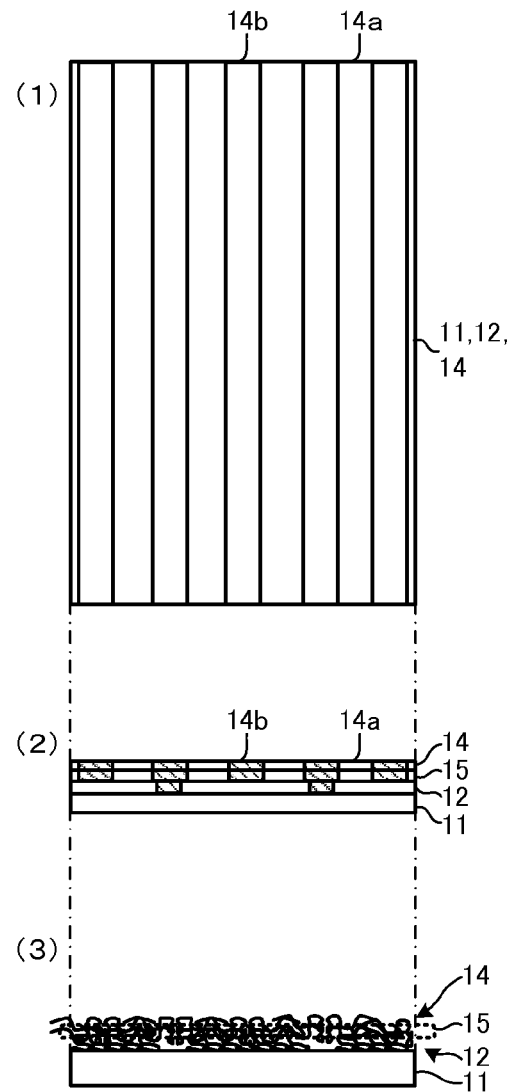

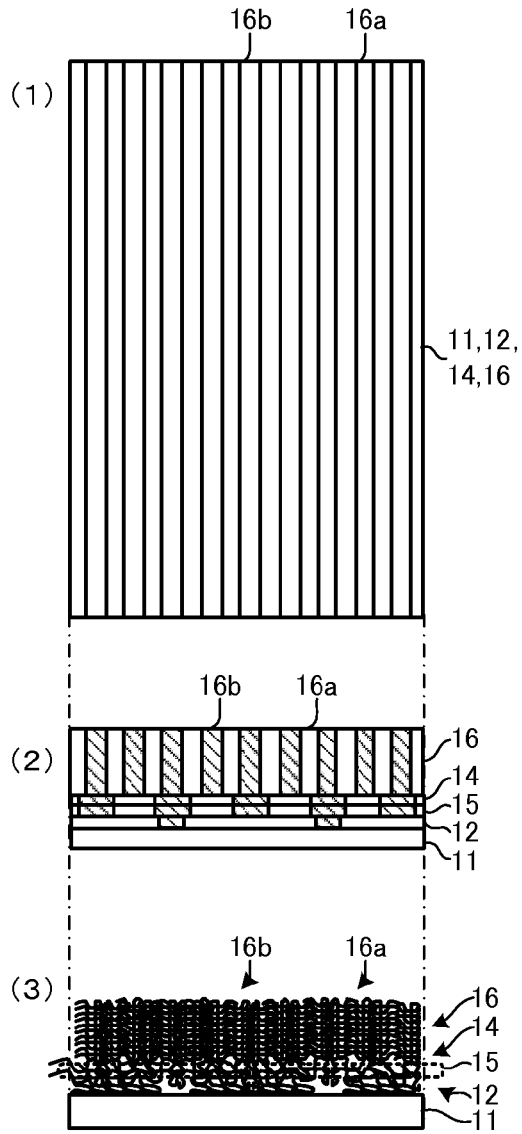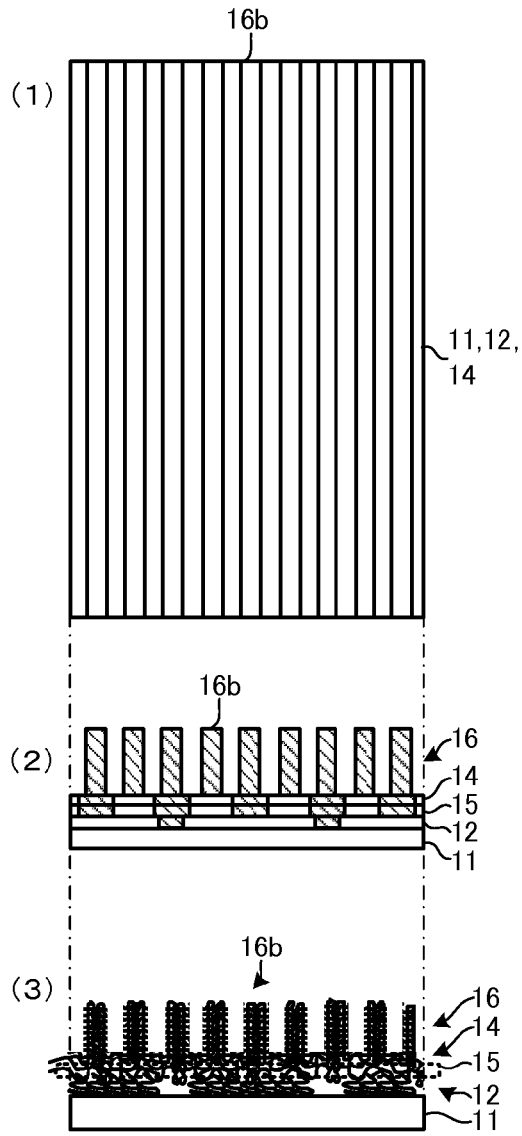

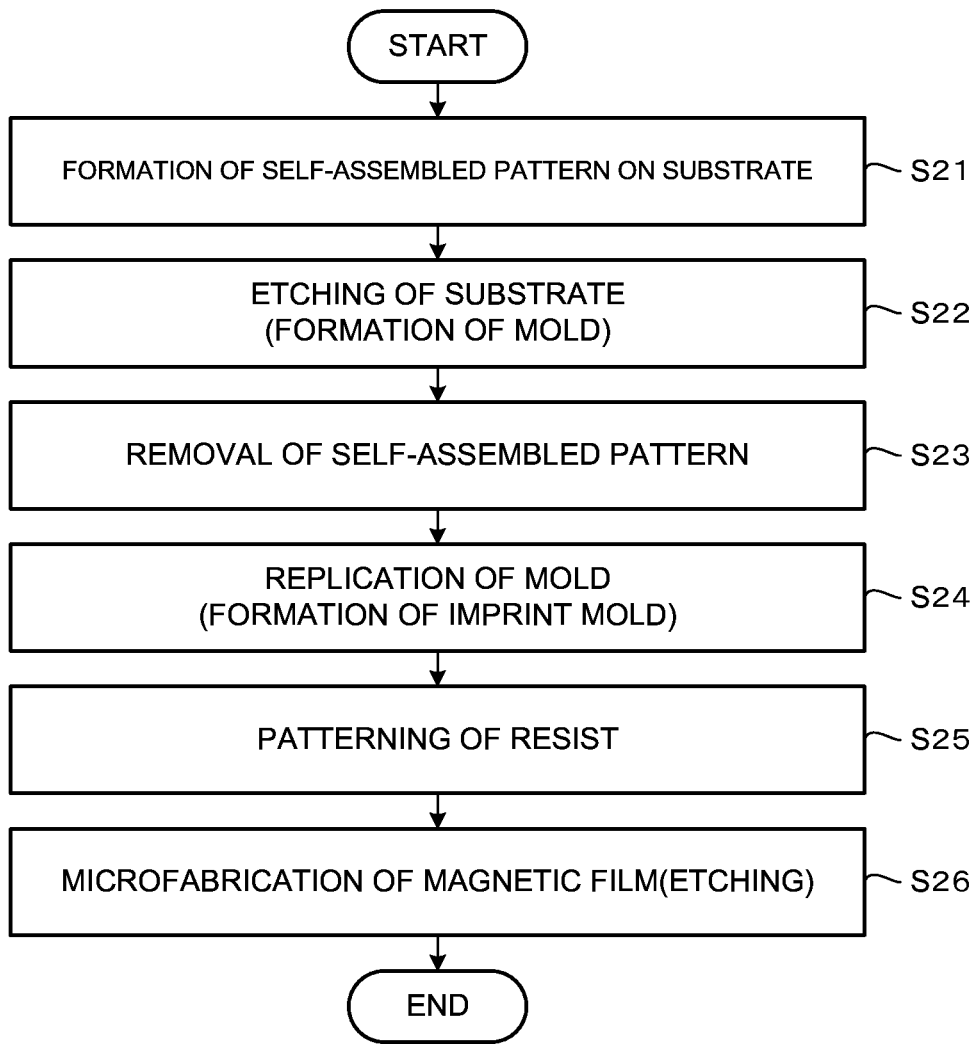

PATTERN FORMING METHOD AND IMPRINT MOLD MANUFACTURING METHOD

CROSS-REFERENCE TO RELATED APPLICATION

This application is based upon and claims the benefit of priority from Japanese Patent Application No. 2012-074879, filed on Mar. 28, 2012; the entire contents of which are incorporated herein by reference.

FIELD

Embodiments described herein relate generally to a pattern forming method and an imprint mold manufacturing method.

BACKGROUND

Microfabrication techniques of a semiconductor, a magnetic film, and so on have been investigated•developed. For example, for a semiconductor element, processing of 20 nm or less has been required. Further, in a magnetic recording device (HDD), a technique of making a recording medium (a patterned media) by microfabricating a magnetic dot array has been considered in order to achieve terabit-class high density.

Here, development of forming a pattern by utilizing phase separation of a block copolymer has been made. For example, a dot pattern can be formed by phase separating a block copolymer of polystyrene and polymethyl methacrylate. By using the dot pattern as an etching mask of magnetic film, the magnetic dot array and the like can be made possible.

However, in a conventional technique, it become difficult to form a small pattern less than 20 nm.

BRIEF DESCRIPTION OF THE DRAWINGS

FIG. 1 is a flowchart depicting a pattern forming method according to a first embodiment.
FIG. 2A to FIG. 2E are views each illustrating a pattern formed in the first embodiment.
FIG. 3A to FIG. 3F are views each illustrating the pattern formed in the first embodiment.
FIG. 5A to FIG. 5F are views each illustrating a pattern formed in a modification example 1.
FIG. 6A to FIG. 6F are views each illustrating a pattern formed in a modification example 2.
FIG. 7A to FIG. 7E are views each illustrating a pattern formed in a modification example 3.
FIG. 8A to FIG. 8F are views each illustrating the pattern formed in the modification example 3.
FIG. 9 is a flowchart depicting an imprint mold manufacturing method according to a second embodiment.

DETAILED DESCRIPTION

Figure 2A:
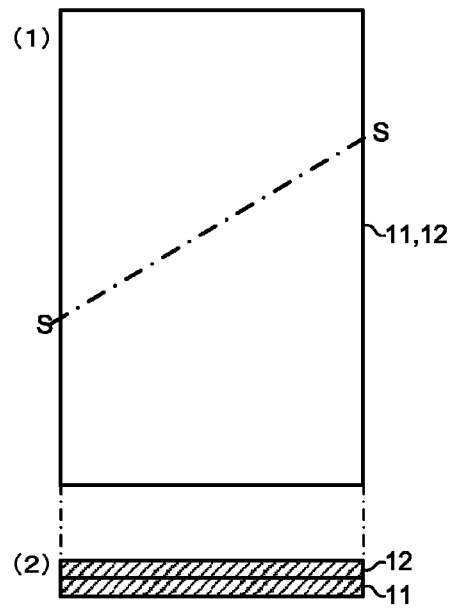

In one embodiment, a pattern forming method includes: forming a functional layer having a functional group to crosslink a first polymer on a substrate; forming a diblock copolymer layer having the first polymer and a second polymer on the functional layer; self-assembling the diblock copolymer layer to form a self-assembled layer, the self-assembled layer having a first domain corresponding to the first polymer, and a plurality of second domains corresponding to the second polymer, the second domains being surrounded by the first domain or interposed in the first domain; cross-linking the first polymer in the self-assembled layer with the functional group in the functional layer to form a bonding layer bonded to the functional layer; and washing or etching the self-assembled layer to remain the bonding layer.

Hereinafter, embodiments will be explained in detain with reference to the drawings.

First Embodiment

A first embodiment will be explained. FIG. 1 is a flowchart depicting a pattern forming method according to the first embodiment. FIG. 2A to FIG. 2E and FIG. 3A to FIG. 3F are views each illustrating a pattern formed in the first embodiment. Among the above drawings, FIG. 2A to FIG. 2E each illustrate a prepattern. FIG. 3A to FIG. 3F each illustrate a self-assembled pattern.

In FIG. 2A to FIG. 2E and FIG. 3A to FIG. 3F, (1) is a top view of the pattern. In FIG. 2A to FIG. 2E and FIG. 3A to FIG. 3F, (2) is a cross-sectional view of the pattern illustrating a state of (1) being taken along S-S. In FIG. 2E and FIG. 3A to FIG. 3F, (3) is a view illustrating a molecule state in an area A in (2). Incidentally, in (2) of FIG. 3A to FIG. 3F, second domains 14b and fourth domains 16b are only hatched for easy understanding.

A. Materials Used for the Patterns

Before explaining the method of forming the patterns, materials used for forming the patterns will be explained.
(1) A self-Assembling Material The self-assembled pattern (self-assembled layers 14 and 16) is/are formed of a self-assembling material. The self-assembling material is a material that is separated into first and second domains (components), of which array patterns are determined by conditions such as compositions and temperatures. By self-assembling, for example, the second domains are arrayed in a state of being surrounded by the first domain (for example, in a cylindrical structure or a spherical structure) or in a state of being interposed in the first domain (for example, in a lamellar structure). As one example of the self-assembling material, a composition containing a block copolymer (a diblock copolymer and so on) can be cited.

In this embodiment, as long as a condition that the above composition is separated into two types of domains different in etching resistance (for example, the first domain component is lower in etching resistance than the second domain component) is satisfied, the composition•molecular weight of the component of a block copolymer are not limited in particular.

As a block copolymer containing the first domain component and the second domain component as above, for example, polystyrene-polymethyl methacrylate (PS-PMMA), polystyrene-poly(ethylene-alt-propylene), polystyrene-polybutadiene (PS-PBD), polystyrene-polyisoprene (PS-PI), polystyrene-polyvinyl methyl ether (PS-PVME), polystyrene-polyethylene oxide (PS-PEO), and so on are cited.

Incidentally, the term "alt" means a polymer alternately having repeated units. That is, poly(ethylene-alt-propylene) is understood to mean a polymer alternately having an ethylene unit and a propylene unit in its main chain.

As a block copolymer having a high cylindrical orientation, a block copolymer of (1) polyacrylate having a liquidcrystalline mesogenic group and (2) polyethylene oxide, polypropylene oxide, polybutylene oxide, or the like is cited.

The total molecular weight of the block copolymer, the molecular weight, the polarity difference, and the like of each of the polymer components are adjusted, thereby making it possible to control a phase separation pitch to be obtained (a self-assembled microdomain dimension, or a spacing between the first domain components or the second domain components to each other).

As one polymer composition having high etching resistance (for example, the second domain component), a diblock copolymer containing a metallic element such as, for example, silicon or iron can be utilized. For example, a copolymer of a silicon compound and an organic composite polymer (for example, a copolymer of polystyrene and polydimethylsiloxane, or a copolymer of polymethyl methacrylate and a POSS (Polyhedral Oligomeric Silsesquioxane) ester of a polymethacrylic acid) or the like is desirable as the diblock copolymer.

(2) The Relationship Between Constituent Materials of the Self-Assembled Layers 14 and 16

In this embodiment, the self-assembled layers 14 and 16 are formed of diblock copolymers (1) and (2) each being a self-assembling material respectively.

The diblock copolymer (1) is constituted of polymers A and B and is phase-separated into a first domain 14a and the second domain 14b corresponding to the polymers A and B respectively. The volume ratio of the polymer B is made smaller than that of the polymer A, and thereby the second domain 14b can be dispersedly disposed in a plurality of areas surrounded by the first domain 14a (the plural second domains 14b).

The diblock copolymer (2) is constituted of polymers C and D and is phase-separated into a third domain 16a and the fourth domain 16b corresponding to the polymers C and D respectively. The volume ratio of the polymer D is made smaller than that of the polymer C, and thereby the fourth domain 16b can be dispersedly disposed in a plurality of areas surrounded by the third domain 16a (the plural fourth domains 16b).

Here, the polymer D of the diblock copolymer (2) has an affinity to the polymer B of the diblock copolymer (1). Thus, when the self-assembled layer 16 is stacked on the self-assembled layer 14, the fourth domains 16b of the polymer D are disposed on the second domains 14b of the polymer B. As a result, based on a disposition pattern of the second domains 14b, a disposition pattern of the fourth domains 16b is determined.

The same material can be used for the polymer A of the diblock copolymer (1) and the polymer C of the diblock copolymer (2). Similarly, the same material can be used for the polymer B of the diblock copolymer (1) and the polymer D of the diblock copolymer (2). By setting in this manner, the affinity relationships among the polymers A to D, (in which the polymers A and C (a group 1) have a high affinity to each other, the polymers B and D (a group 2) also have a high affinity to each other, and the polymers in the group 1 have a low affinity to each other and the polymers in the group 2 have a low affinity to each other), are satisfied. As a result, the formation of the microscopic self-assembled pattern by the self-assembled layers 14 and 16 being stacked is made possible.

However, as long as the above affinity relationships are satisfied, the polymer A and the polymer C or the polymer B and the polymer D do not have to be the same.

(3) Phase Separation Pitches P1 and P2 of the Self-Assembled Layers 14 and 16

Figure 4A:
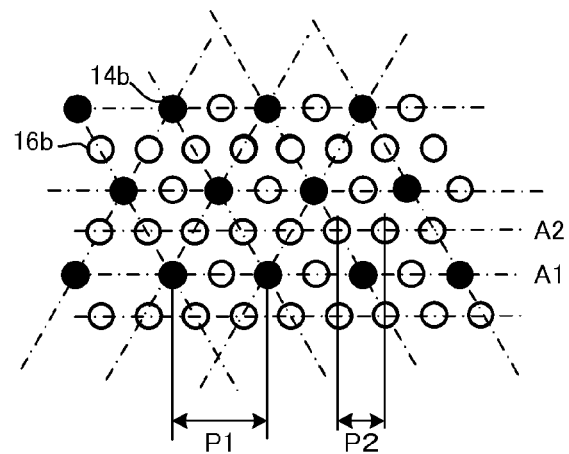
FIG. 4A and FIG. 4B are views each illustrating one example of the relationship between phase separation pitches in a self-assembled layer.
Figure 4B:
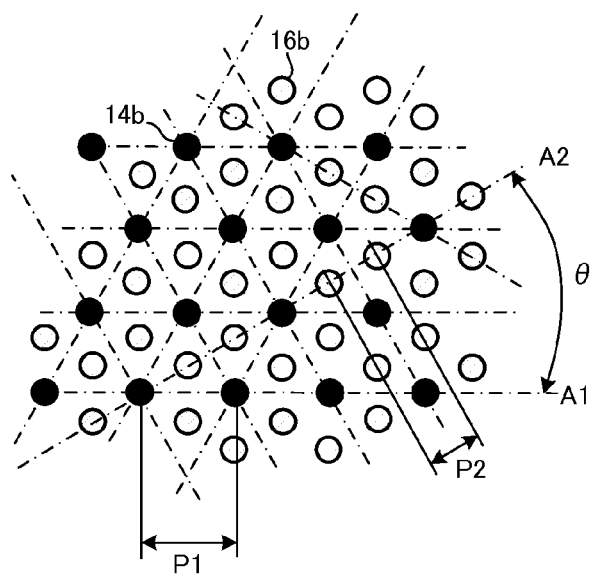
Figure 6E:
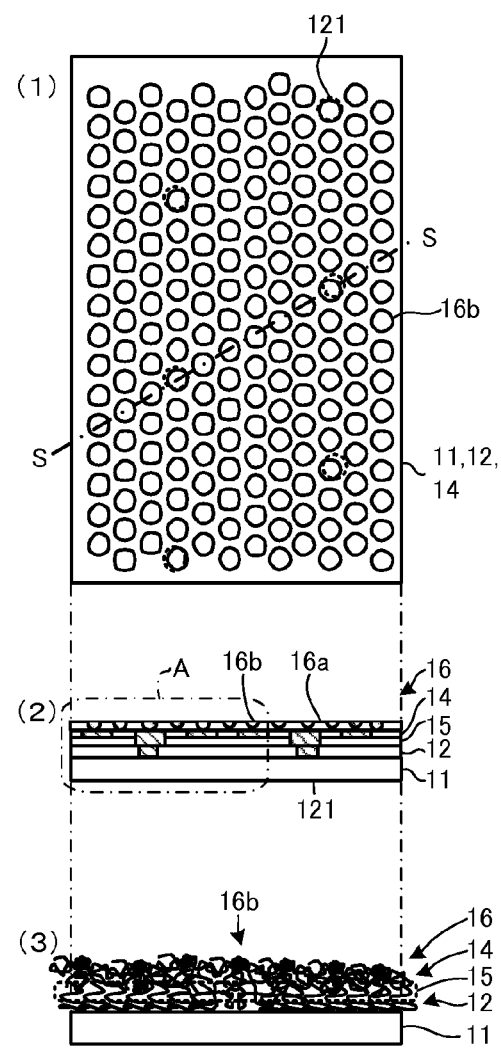
Figure 6F:
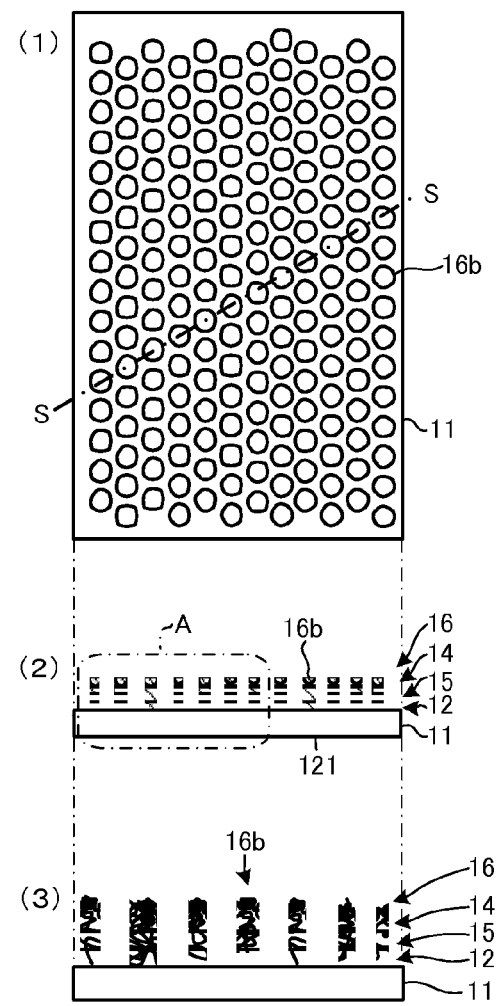
Figure 7A:
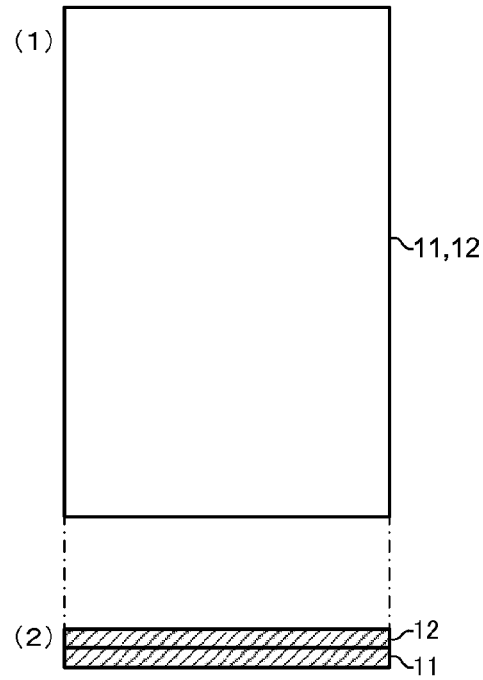
Figure 7B:
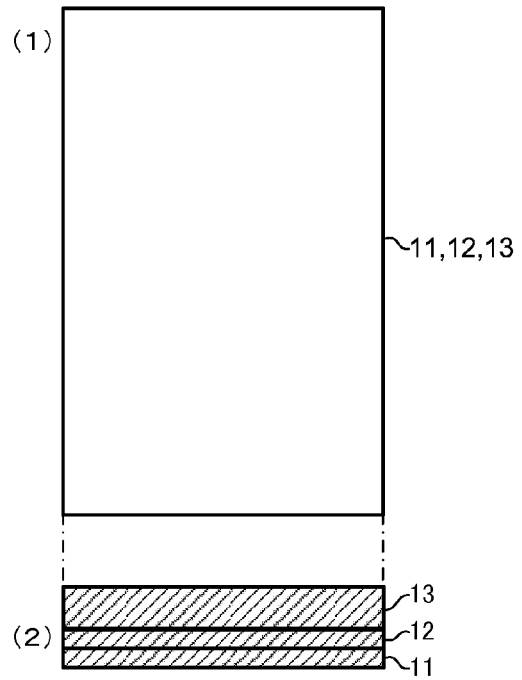
Figure 7C:
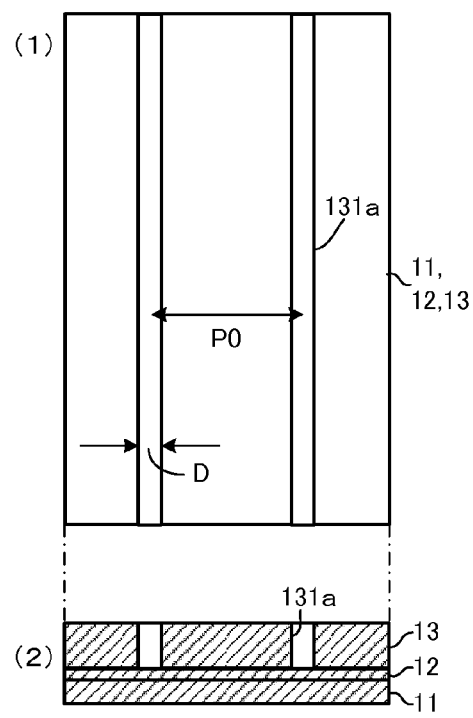
Figure 7D:
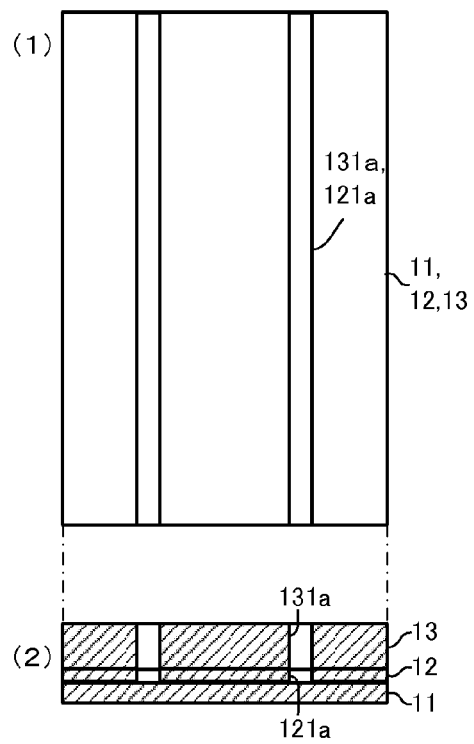
Figure 8F:
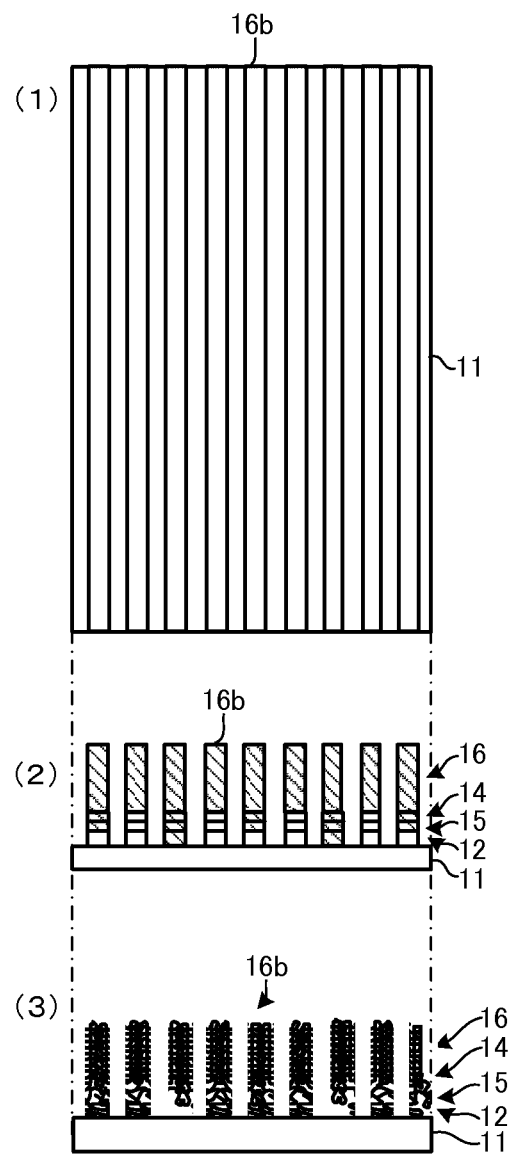

FIG. 4A and FIG. 4B are views each illustrating one example of the relationship between the phase-separation pitches P1 and P2 of the self-assembled layers 14 and 16.

As has been already described, in the self-assembled layer 14, the second domain 14b is dispersedly disposed in a plurality of areas. Further, in the self-assembled layer 16, the fourth domain 16b is dispersedly disposed in a plurality of areas. The spacing (the shortest distance) between these plural second domains 14b is the phase-separation pitch (a self-assembled microdomain dimension) P1. Further, the spacing (the shortest distance) between the plural fourth domains 16b is the phase-separation pitch (a self-assembled microdomain dimension) P2.

In this embodiment, the phase-separation pitch P2 is smaller than the phase-separation pitch P1 (P2<P1). As a result, in the self-assembled layer 16 rather than the self-assembled layer 14, the microfabrication of the pattern (the disposition of a larger number of the fourth domains 16b) is made possible.

Here, it is preferable to match the phase-separation pitch P1 and the phase-separation pitch P2 to each other as below in order to make the disposition pattern of the fourth domains 16b proper.

In FIG. 4A, the second domains 14b are disposed hexagonally. That is, the plural second domains 14b are disposed so that equilateral triangles each with the second domains 14b as its vertexes may be arranged. At this time, the length of a side of the above equilateral triangle corresponds to the phase separation pitch P1.

On the other hand, the fourth domain 16b is disposed not only at vertexes of equilateral triangles but also at the middle of a side of the above equilateral triangles, and the half of the length of the side corresponds to the phase-separation pitch P2. That is, the phase separation pitch P2 is ($\frac{1}{2}$=0.5) of the phase separation pitch P1. Incidentally, the illustration of the fourth domains 16b overlapping with the second domains 14b is omitted for easy understanding.

Also in FIG. 4B, the second domains 14b are hexagonally disposed at vertexes of equilateral triangles. On the other hand, the fourth domain 16b is disposed not only at vertexes of equilateral triangles but also at the center of the above equilateral triangles. In the above case, ($1/\sqrt{3}$) of a side of the above equilateral triangle corresponds to the phase separation pitch P2. That is, the above phase separation pitch P2 is ($1/\sqrt{3}$=0.578) of the phase separation pitch P1. Incidentally, similarly to FIG. 4A, the illustration of the fourth domains 16b overlapping with the second domains 14b is omitted for easy understanding.

In this manner, the phase separation pitch P2 is set to ($\frac{1}{2}$) or ($1/\sqrt{3}$) of the phase separation pitch P1, thereby making it possible to dispose the fourth domains 16b more highly densely and to make the fourth domains 16b suitable for microfabrication.

The above relationship between the phase separation pitch P1 and the phase separation pitch P2 can be generalized. Before describing the above description, array axes A1 and A2 of the second and fourth domains 14b and 16b will be explained.

As illustrated in FIG. 4A and FIG. 4B, the second and fourth domains 14b and 16b have the array axis A1 and the array axis A2 respectively. The plural second domains 14b are arrayed along the array axis A1 with the phase separation pitch P1. The plural fourth domains 16b are arrayed along the array axis A2 with the phase separation pitch P2.

Incidentally, the second domains 14b and the fourth domains 16b are hexagonally arrayed and aligned in three directions (have three array axes), but the relationships in terms of angles among the three array axes are determined, and thus it is sufficient if the single array axis A1 for the second domains 14b and the single array axis A2 for the fourth domains 16b are taken as a matter.

In FIG. 4A, the array axes A1 and A2 are parallel to each other (an angle θ between the array axes A1 and A2 is 0°). In contrast to this, in FIG. 4B, the angle θ between the array axes A1 and A2 is not 0° (θ=30°).

As illustrated in FIG. 4A, in the case of the angle θ between the array axes A1 and A2 being 0°, it is possible to set the phase separation pitch P2 to (1/(n+1)) of the phase separation pitch P1 (n: an integer being equal to or more than 1). In FIG. 4A, the single fourth domain 16b is added between the second domains 14b, but the number of the fourth domains 16b to be added can be set to 3, 4, . . . , and n.

As illustrated in FIG. 4B, in the case of the angle θ between the array axes A1 and A2 not being 0°, it is possible to set the angle θ to 23.4°, 19.1°, 13.9°, or 10.9° other than 30°. As long as the angle θ is such a value, by adjusting the phase separation pitch P2, it is possible to hexagonally dispose the fourth domains 16b with the hexagonally disposed second domains 14b set as vertexes. In the above case, the phase separation pitch P2 becomes a value other than (1/(n+1)) of the phase separation pitch P1. Further, as the angle θ becomes smaller, the phase separation pitch P2 becomes smaller with respect to the phase separation pitch P1.

As can be understood from the above, the phase separation pitch P2 being about equal to or less than $(1/\sqrt{3})$ of the phase separation pitch P1 can be employed. Then, the disposition pattern of the fourth domains 16b is determined corresponding to the relationship (ratio) between/of the phase separation pitches P1 and P2.

Here, in terms of the relationship (ratio) between/of these phase separation pitches P1 and P2, a certain range is allowed. Since the fourth domains 16b are disposed on the second domains 14b, even though the relationship (ratio) between/of the phase separation pitches P1 and P2 deviates a little from the original value (for example, P2=P1*(1/(n+1))), the disposition of the fourth domains 16b is made proper (for example, between the second domains 14b, (n+1) pieces of the fourth domains 16b are additionally disposed). Based on the disposition of the second domains 14b and the phase separation pitch P2, the fourth domains 16b are disposed most stably.

(4) A Constituent Material of a Substrate 11

The substrate 11 has a material having a greater affinity to, of the diblock copolymer (1), the polymer B (the second domains 14b) than to the polymer A (the first domain 14a) at least on its surface. For the substrate 11, for example, a metal substrate, a glass substrate, a silicon substrate, or the like can be variously used. Further, as the substrate 11, a substrate formed in a manner that a thin film made of a magnetic substance, a semiconductor, an insulating film, a conductive film, and so on is formed on a metal substrate, a glass substrate, a silicon substrate, or the like may also be used. That is, the substrate 11 can be formed by directly processing a substrate material. Alternatively, the substrate 11 can also be formed by forming a thin film on a substrate.

The constituent material of the substrate 11 and constituent materials of a functional layer 12, in consideration of the affinity between the polymers A and B of the diblock copolymer (1), are combined properly to be used.

(5) The Constituent Materials of the Functional Layer 12

The constituent materials of the functional layer 12 (a functional material) have/has a high affinity to the polymer A of the diblock copolymer (1). Further, the functional material has a group to cross-link the polymer A.

The functional material has a greater affinity to, of the diblock copolymer (1), the polymer A (the first domain 14a) than to the polymer B (the second domains 14b). As the functional material, there is cited for example, a homopolymer made of one of the two components, (which is the polymer A), of the diblock copolymer of the self-assembling material forming the self-assembled layer 14.

Further, in the case when the polymer A is a polymer component having relatively high hydrophilicity, (of, for example, polymethyl methacrylate (PMMA), polyethylene oxide (PEO), or the like), general hydrophilic materials (Si, SOG (Spin on Glass), a phenolic resist material, and so on) can be widely used as the functional material. In the above case, as the constituent material of the substrate 11 (the substrate material), for example, SiN is selected, and Si, SOG, a phenolic resist material, and so on can be deposited and utilized as the functional layer 12.

As the group to cross-link the polymer A of the diblock copolymer (1), for example, benzophenone, a benzylalkoxy group, an amino group, or an acid anhydride structure can be used. In the case of the polymer A having a polystyrene structure, benzophenone, a benzylalkoxy group, or the like cross-links the above polystyrene structure by light or an acid catalyst. Further, in the case when the polymer A of the diblock copolymer (1) has an epoxy group, an amino group or an acid anhydride structure cross-links the above epoxy group.

The functional material is not desirably dissolved in solvents of a resist and the diblock copolymer due to chemically bonding to the substrate 11, the cross-linking by heat or light, or the like. It is conceivable to introduce a hydroxyl group or a coupling group (alkoxysilane, chlorosilane, or the like) to the functional material in order that the functional material should chemically bond to the constituent material of the substrate 11 (the substrate material of, for example, silicon). That is, a polymer material having a hydroxyl group or a coupling group can be utilized as the functional material.

B. Formation Procedure of the Patterns

Hereinafter, the formation procedure of the patterns will be explained.

(1) Formation of the Functional Layer 12 on the Substrate 11 (FIG. 2A, Step S11)

The functional layer 12 is formed on the substrate 11 (FIG. 2A). As has been already described, the functional material forming the functional layer 12 has a group to cross-link the polymer A and has a high affinity to the polymer A of the diblock copolymer (1).

(2) Patterning of the Functional Layer 12 (FIG. 2B to FIG. 2E, Step S12)

The functional layer 12 is patterned to have a plurality of openings 121 formed therein (formation of the prepattern).

Figure 2B:
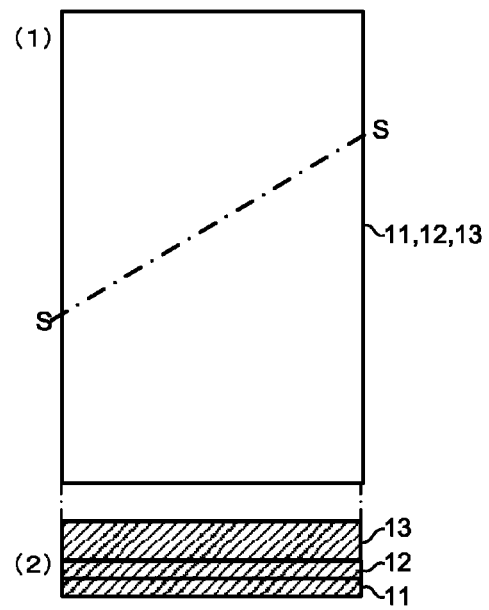

1) A resist layer 13 is formed on the functional layer 12 (FIG. 2B).

Figure 2C:
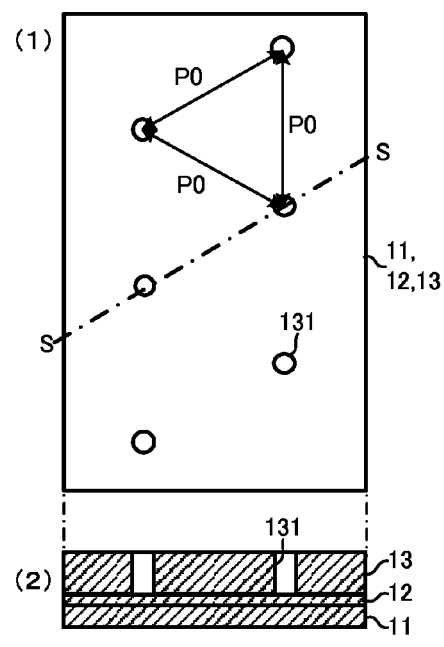

2) The resist layer 13 is patterned (FIG. 2C). A hexagonal dot pattern is drawn on the resist layer 13 by, for example, an electron beam and is developed.

Figure 2D:
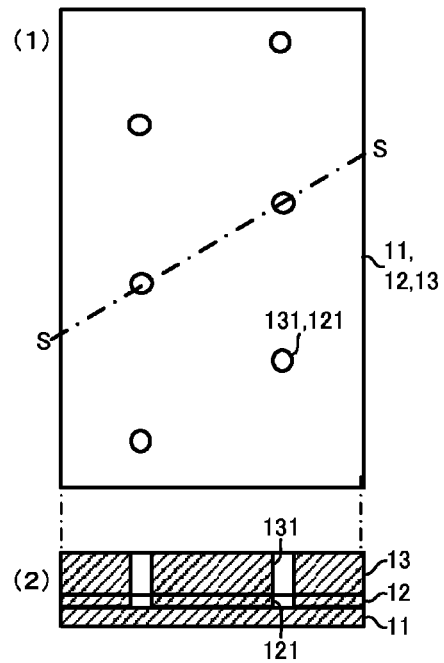

3) By etching with the resist layer 13 as a mask, some portions of the functional layer 12 are removed (FIG. 2D). That is, the plural openings 121 are formed in the functional layer 12 and the surface of the substrate 11 is exposed.

4) The resist layer 13 is removed (FIG. 2E). As a result, the functional layer 12 having the openings 121 corresponding to the pattern by an electron beam is formed.

In this manner, the functional layer 12 having the prepattern (the plural openings 121, here) is formed. At this time, the plural openings 121 are disposed hexagonally. That is, the openings 121 are disposed so that equilateral triangles each with the openings 121 as its vertexes may be arranged. At this time, the length of a side of the above equilateral triangle corresponds to a spacing (the shortest distance, a pitch P0, and a self-assembled microdomain dimension) between the openings 121.

(3) Formation of the Self-Assembled Layer 14 (FIG. 3A, Step S13)

The diblock copolymer (1) is applied on the functional layer 12 to self-assemble, and thereby the self-assembled layer 14 is formed.

Heat or a solvent can be utilized for the self-assembling. That is, the diblock copolymer (1) is heated to be annealed, thereby accelerating the phase separation into the polymers, and allowing the diblock copolymer (1) to self-assemble. Further, vapor of a solvent is made to infiltrate into a layer of the diblock copolymer (1) (a polymer film), and thereby it is possible to self-assemble the diblock copolymer (1). By the vapor of a solvent, the polymer film is swollen, thereby making it possible to accelerate the movement and phase separation of the polymers A and B. Incidentally, the vapor of a solvent to be used here may also be of either a single solvent or a mixture of plural solvents.

The self-assembled layer 14 is phase separated into the first domain 14a and the second domain 14b corresponding to the polymers A and B of the diblock copolymer (1) respectively. The plural second domains 14b are surrounded by the first domain 14a.

At this time, the pitch P0 between the openings 121 and the spacing (the phase separation pitch P1, or a self-assembled microdomain dimension) between the second domains 14b have the same relationship (ratio) as those of the already described phase separation pitches P1 and P2 (for example, $P1=P2*(1/(n+1))$, n: an integer being equal to or more than 1). The phase separation pitch P1 is smaller than the pitch P0, and thereby based on the pattern drawn by an electron beam (the pattern of the openings 121), the second domains 14b are disposed in a manner to make each of the spacings (pitches, or a self-assembled microdomain dimension) narrower. Incidentally, in this embodiment, the phase separation pitch P1 is set to $(1/(2+1))$ of the pitch P0.

In this embodiment, for the diblock copolymer (1), one to be phase separated cylindrically is used. That is, the second domains 14b each have a cylindrical shape.

(4) Cross-Linking Reaction of the Self-Assembled Layer 14 and the Functional Layer 12 (FIG. 3B, Step S14)

The group of the functional layer 12 and the polymer A of the diblock copolymer (1) are cross-linked with each other. The above cross-linking reaction is to make the following partial removal of the self-assembled layer 14 possible (to be capable of removing a later-described non-bonding layer to remain a bonding layer in Step S15).

As a result of the cross-linking reaction, between the functional layer 12 and the self-assembled layer 14, a cross-linking bond 15 is formed. By the above cross-linking bond 15, the self-assembled layer 14 is divided into the bonding layer (a lowermost layer) that is bonded to the functional layer 12 and the non-bonding layer that is not bonded to the functional layer 12. The bonding layer is chemically bonded to the functional layer 12 directly or indirectly.

(5) Washing or Etching of the Self-Assembled Layer 14 (FIG. 3C, Step S15)

By using an organic solvent or the like, the self-assembled layer 14 is washed or etched to thereby remove part of the self-assembled layer 14. That is, the layer that is not chemically bonded to the functional layer 12 directly or indirectly (the non-bonding layer) is removed to remain the bonding layer.

The washing or etching is to prevent the component of the diblock copolymer (1) from mixing in the diblock copolymer (2) in the following Step S16. It is set that in a state where the self-assembled layer 14 (the diblock copolymer (1)) that is not bonded to the functional layer 12 remains, the diblock copolymer (2) is applied on the self-assembled layer 14. In the above case, there is a possibility that the component of the diblock copolymer (1) that is not bonded to the functional layer 12 is mixed in the diblock copolymer (2) and thereby the accuracy of the disposition of the fourth domains 16b deteriorates.

Thus, the non-bonding layer of the self-assembled layer 14 is removed to remain only the lowermost layer (the bonding layer). The self-assembled layer 16 is formed on the above lowermost layer, thereby making it possible to secure the accuracy of the disposition of the fourth domains 16b in the self-assembled layer 16.

(6) Formation and Self-Assembling of the Self-Assembled Layer 16 (FIG. 3D, Step S16)

On the lowermost layer (the bonding layer) of the remaining self-assembled layer 14, the diblock copolymer (2) is applied to self-assemble, and thereby the self-assembled layer 16 is formed.

For the self-assembling, heat or a solvent can be utilized. That is, the diblock copolymer (2) is heated to be annealed to thereby self assemble. Further, vapor of a solvent is made to infiltrate into a layer of the diblock copolymer (2) (a polymer film), thereby making it possible to self-assemble the diblock copolymer (2). By the vapor of a solvent, the polymer film is swollen, thereby making it possible to accelerate the movement and phase separation of the polymers C and D. Incidentally, the vapor of a solvent to be used here may also be of either a single solvent or a mixture of plural solvents.

The fourth domains 16b in the self-assembled layer 16 are disposed corresponding to the disposition pattern of the second domains 14b in the self-assembled layer 14. As has been already described, since the phase separation pitch P2 is smaller than the phase separation pitch P1, based on the second domains 14b in the self-assembled layer 14, the fourth domains 16b are disposed in a manner to make each of the spacings (pitches, or a self-assembled microdomain dimension) narrower. In this embodiment, the phase separation pitch P2 is set to $(1/2)$ of the pitch P1.

In this embodiment, for the diblock copolymer (2), one to be phase-separated cylindrically is used. That is, the fourth domains 16b each have a cylindrical shape.

Figure 3F:
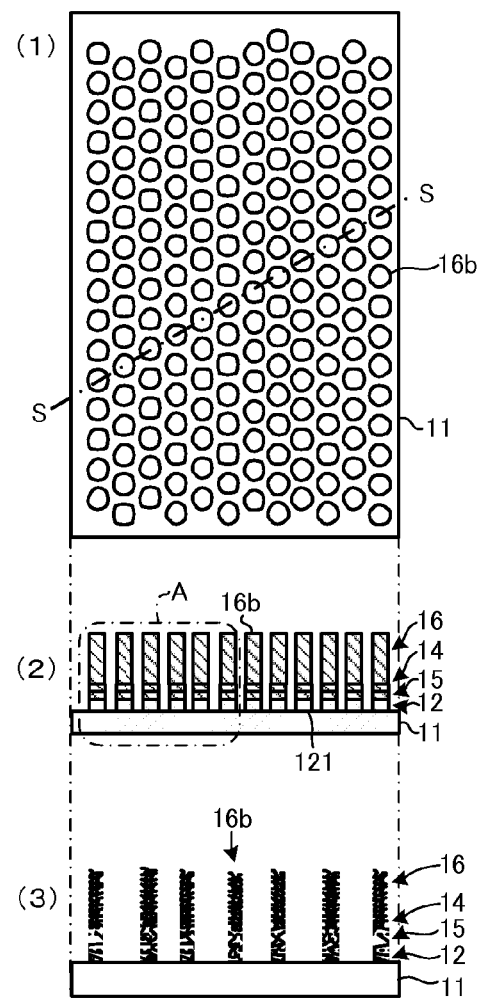

(7) Partial Etching of the Self-Assembled Layers 14 and 16 (FIG. 3E and FIG. 3F, Step S17)

The self-assembled layer 16 is etched partially. That is, the polymer C (the third domain 16a) in the self-assembled layer 16 is removed by etching to remain the polymer D (the fourth domains 16b) (FIG. 3E). Next, the self-assembled layer 14 is partially etched. That is, the polymer A (the first domain 14a) in the self-assembled layer 14 is removed by etching to remain the polymer B (the second domains 14b). An etching mask to be constituted is made (FIG. 3E). As a result, the self-assembled pattern constituted by the patterns (the second and fourth domains 14b and 16b) of the polymers B and D is formed.

Further, the functional layer 12 (and further the substrate 11) are etched with the self-assembled pattern as the etching mask (FIG. 3F).

As described above, the pattern of the second domains 14b in the self-assembled layer 14 and the pattern of the fourth domains 16b in the self-assembled layer 16 are formed sequentially so as to correspond to the prepattern (the openings 121) formed by an electron beam. The pitch P0 between the openings 121, the phase separation pitch P1 between the second domains 14b, and the phase separation pitch P2 between the fourth domains 16b are made smaller sequentially, thereby making it possible to form the self-assembled pattern having the positional accuracy corresponding to the prepattern (the openings 121) formed by an electron beam.

In this embodiment, the self-assembled layer 14 is cross-linked with the functional layer 12 to thereby form the cross-linking bond 15 between the self-assembled layer 14 and the functional layer 12. As a result, the self-assembled layer 14 is divided into the layer that is chemically bonded to the functional layer 12 directly or indirectly (the lowermost layer: the bonding layer) and the layer that is not chemically bonded to the functional layer 12 (the non-bonding layer).

From both the bonding layer and the non-bonding layer, the non-bonding layer is removed to remain the lowermost layer (the bonding layer). An area good in the disposition pattern (the lowermost layer) in the self-assembled layer 14 is used effectively, thereby making it possible to improve the accuracy of the disposition pattern of the self-assembled pattern to be formed finally.

In the foregoing, the polymers B and D as compositions having high etching resistance (to remain as a mask) form projection portions corresponding to the disposition pattern of the second domains 14b and the fourth domains 16b. To the contrary, the polymers A and C may also be set as compositions having high etching resistance. In the above case, it is possible to form recessed portions corresponding to the disposition pattern of the second domains 14b and the fourth domains 16b.

Modification Example 1

A modification example 1 will be explained. A pattern forming method according to the modification example 1 is depicted in FIG. 1. FIG. 5A to FIG. 5F each illustrate a self-assembled pattern in the modification example 1 and correspond to FIG. 3A to FIG. 3F. Incidentally, the pattern forming method according to the modification example 1 is depicted in FIG. 1. Further, a prepattern in the modification example 1 is illustrated in FIG. 2A to FIG. 2E.

In the modification example 1, the shape of each of the second domains 14b in the self-assembled layer 14 and each of the fourth domains 16b in the self-assembled layer 16 is a sphere. As the prepattern, a hexagonal dot pattern is used similarly to the embodiment.

The modification example 1 is not essentially different from the first embodiment except that the shape of each of the second domains 14b and the fourth domains 16b is a sphere, so that its detailed explanation is omitted.

Modification Example 2

A modification example 2 will be explained. FIG. 6A to FIG. 6F each illustrate a self-assembled pattern in the modification example 2 and correspond to FIG. 3A to FIG. 3F. Incidentally, a pattern forming method according to the modification example 2 is depicted in FIG. 1. Further, a prepattern in the modification example 2 is illustrated in FIG. 2A to FIG. 2E.

In the modification example 2, the combination of the shape of each of the second domains 14b in the self-assembled layer 14 and the shape of each of the fourth domains 16b in the self-assembled layer 16 includes a cylinder and a sphere. As the prepattern, a hexagonal dot pattern is used similarly to the embodiment.

The modification example 2 is not essentially different from the first embodiment except that the shape of each of the fourth domains 16 is a sphere, so that its detailed explanation is omitted.

Modification Example 3

A modification example 3 will be explained. FIG. 7A to FIG. 7E each illustrate a prepattern in the modification example 3 and correspond to FIG. 2A to FIG. 2E. FIG. 8A to FIG. 8F each illustrate the prepattern in the modification example 3 and correspond to FIG. 3A to FIG. 3F. Incidentally, a pattern forming method according to the modification example 3 is depicted in FIG. 1.

In the modification example 3, each of openings 121a (the prepattern) has a line shape. A line pattern with a width D and a pitch P0 is formed. Further, the shape of each of the second domains 14b in the self-assembled layer 14 and each of the fourth domains 16b in the self-assembled layer 16 is a lamella.

In the modification example 3, a line-shaped self-assembled pattern corresponding to the prepattern (the openings 121a) can be formed. The line-shaped self-assembled pattern can be applied to a wiring of a miniaturized integrated circuit and so on. Further, the line-shaped self-assembled pattern can be used as an imprint mold by being transferred to a substrate.

Second Embodiment

A second embodiment will be explained. FIG. 9 is a flow-chart depicting an imprint mold forming method and a magnetic film processing method according to the second embodiment. FIG. 10A to FIG. 10F are views each illustrating an imprint mold formed and a magnetic film processed in the second embodiment.

Figure 10A:
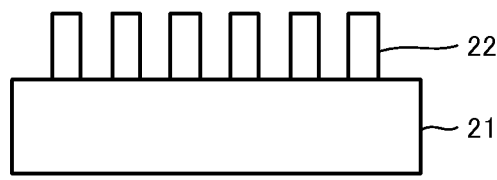
FIG. 10A to FIG. 10F are views each illustrating an imprint mold formed in the second embodiment.

(1) Formation of a Self-Assembled Pattern 22 on a Substrate 21 (Step S21, FIG. 10A)

The self-assembled pattern 22 is formed on the substrate 21 (for example, a silicon substrate). For example, by the procedure depicted in FIG. 1, self-assembled layers 14 and 16 are formed to be etched, and thereby the self-assembled pattern 22 can be formed.

Figure 10B:
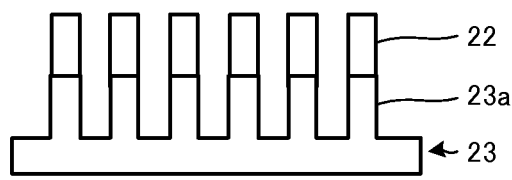

(2) Etching of the Substrate 21 (Step S22, FIG. 10B)

The substrate 21 is etched with the self-assembled pattern 22 as a mask. As a result, a mold 23 having projection portions 23a corresponding to the self-assembled pattern 22 is formed (formation of a first mold).

Figure 10C:

(3) Removal of the Self-Assembled Pattern 22 (Step S23, FIG. 10C)

The self-assembled pattern 22 is removed to take out the mold 23 (for example, a silicon mold).

Figure 10D:

(4) Replication of the Mold 23 (Step S24, FIG. 10D)

A replica of the mold 23 is made. For example, Ni is electroformed on the mold 23, and thereby a replica 24 made of Ni is made to be set as the imprint mold.

Incidentally, it is also possible to use the mold 23 as the imprint mold without making the replica 24.

Figure 10E:
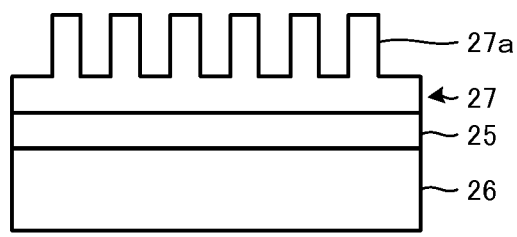

(5) Patterning of a Resist (Step S25, FIG. 10E)

A resist is patterned by using the replica 24. For example, the resist is applied on a substrate (for example, a glass substrate) 26 having a magnetic film 25 (formation of a resist layer 27 for imprinting) and is cured in a state of being pressed by the replica 24. As a result, the resist layer 27 has recessed portions 27a corresponding to projection portions 24a of the replica 24.

Figure 10F:
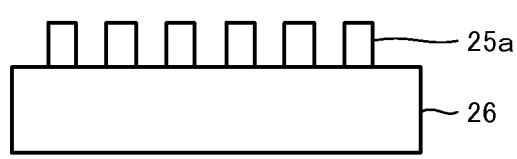

(6) Microfabrication of the Magnetic Film 25 (Step S26, FIG. 10F)

The magnetic film 25 is microfabricated (etched) with the patterned resist layer 27 as a mask. As a result, a pattern having magnetic dots 25a can be formed.

EXAMPLES

Hereinafter, Examples 1 to 7 will be described. Here, an example where a bit patterned media is made by using the self-assembled pattern will be described. Incidentally, it is also possible to miniaturize a semiconductor or the like to form a semiconductor element by using the self-assembled pattern.

Example 1

The example 1 will be explained. In the example 1, the spherical-shaped self-assembled layers 14 and 16 were formed sequentially.

Here, as the functional material, a chlorosilane compound having a benzophenone structure was used. That is, a chlorosilane compound having a benzophenone structure was applied on the substrate 11 made of silicon, and the substrate 11 was spin coated with a chlorosilane compound having a benzophenone structure. In this manner, the functional layer 12 with a benzophenone group existing on the surface of the substrate 11 was formed.

Here, when the chlorosilane compound was applied, a small amount of a triethylamine compound was added as a reaction accelerator. The chlorosilane compound traps chlorine, and thereby the cross-linking reaction is accelerated. Incidentally, a triethylamine compound does not also have to be added.

A positive electron beam resist (ZEP) was applied on the functional layer 12 to be drawn•developed by an electron beam. As a result, the resist layer 13 having the openings 131 hexagonally disposed therein with the pitch P0 (=108 nm) was formed.

By an oxygen RIE (reactive ion etching) device, the functional layer 12 corresponding to hole portions (the openings 131) of the resist layer 13 was removed, and then the substrate 11 was washed with PGMEA (Propyleneglycol monomethylether acetate) to remove the resist layer 13. As a result, the functional layer 12 having the openings 121 hexagonally disposed therein with the pitch P0 (=108 nm) (the prepattern) was obtained.

A 2% PGMEA solution of PS-PDMS having Mn (mean molecular weight) 37500 (PS: 30000 and PDMS: 7500) was applied on the patterned functional layer 12 to be annealed at 180° C. for five hours. As a result, the self-assembled layer 14 having the second domains 14b hexagonally arrayed with the pitch P1 (=36 nm) was able to be obtained.

The self-assembled layer 14 was exposed to an ultra-high pressure mercury lamp for 10 minutes to cross-link benzophenone in the functional layer 12 with PS-PDMS. Thereafter, the self-assembled layer 14 was washed with PGMEA to remove PS-PDMS (Mn: 37500) that did not cross-link react with the functional layer 12.

On the self-assembled layer 14 left remaining in this manner, a 0.7% PGMEA solution of PS-PDMS having Mn 8500 (PS: 7000 and PDMS: 1500) was applied to be annealed at 100° C. for five hours (formation of the self-assembled layer 16).

An obtained phase separation pattern (the self-assembled layers 14 and 16) was/were etched by $CF_4$ gas and oxygen gas, and thereby a PDMS dot pattern with the pitch P2 (=12 nm) was obtained (formation of the self-assembled pattern). The hexagonally packed ratio of PDMS dot in an area 400 nm in side length where dot positions were observed by an AFM (Atomic Force Microscope) was 100%.

As described above, in the example 1, "P1/P0=⅓" and "P2/P1=⅓" (the pitches P0, P1, and P2=108, 36, and 12 nm) were set, and the microfabrication of the pitches was achieved at two stages. As a result, the good self-assembled pattern was able to be formed.

Example 2

The example 2 will be explained. In the example 2, similarly to the example 1, the spherical-shaped self-assembled layers 14 and 16 were formed sequentially. However, the pitch P2 in the self-assembled layer 16 is different from that in the example 1.

The formation of the self-assembled layer 14, the cross-linking reaction, and the removal of PS-PDMS that did not cross-link react were set the same as those in the example 1.

PS-PDMS having Mn 15000 (PS: 12000 and PDMS: 3000) was applied on the remaining self-assembled layer 14 to be annealed in vacuum at 160° C. for 12 hours (formation of the self-assembled layer 16).

An obtained phase separation pattern (the self-assembled layers 14 and 16) was/were etched by $CF_4$ gas and oxygen gas, and thereby a PDMS dot pattern with the pitch P2 (=21 nm) was obtained. The hexagonally packed ratio of PDMS dot in an area 400 nm in side length where dot positions were observed by an AFM was 100%.

As described above, in the example 2, "P1/P0=⅓" and "P2/P1≠1/√3" (the pitches P0, P1, and P2=108, 36, and 21 nm) were set, and the microfabrication of the pitches was achieved at two stages. As a result, the good self-assembled pattern was able to be formed.

Example 3

The example 3 will be explained. In the example 3, similarly to the example 1, the spherical-shaped self-assembled layers 14 and 16 were formed sequentially. However, for the formation of the self-assembled layers 14 and 16, a solvent (N-methyl pyrrolidinone) was used in place of heat.

By the method described in the example 1, the functional layer 12 having the openings 121 hexagonally disposed therein at the pitch P0 (=108 nm) (the prepattern) was obtained.

A 2% PGMEA solution of PS-PDMS having Mn 37500 (PS: 30000 and PDMS: 7500) was applied on the patterned functional layer 12 to be exposed to a solvent atmosphere of N-methyl pyrrolidinone for two hours. As a result, the self-assembled layer 14 having the second domains 14b hexagonally arrayed with the pitch P1 (=36 nm) was able to be obtained.

The self-assembled layer 14 was exposed to an ultra-high pressure mercury lamp for 10 minutes to cross-link benzophenone in the functional layer 12 with PS-PDMS. Thereafter, the substrate 11 was washed with PGMEA to remove PS-PDMS (Mn: 37500) that did not cross-link react with the functional layer 12.

A 0.7% PGMEA solution of PS-PDMS having Mn 8500 (PS: 7000 and PDMS: 1500) was applied on the self-assembled layer 14 left remaining in this manner to be exposed to the solvent atmosphere of N-methyl pyrrolidinone for two hours (formation of the self-assembled layer 16).

An obtained phase separation pattern (the self-assembled layers 14 and 16) was/were etched by $CF_4$ gas and oxygen gas, and thereby a PDMS dot pattern with the pitch P2 (=12 nm) was obtained (formation of the self-assembled pattern). The hexagonally packed ratio of PDMS dot in an area 400 nm in side length where dot positions were observed by an AFM (Atomic Force Microscope) was 100%.

As described above, in the example 3, "P1/P0=⅓" and "P2/P1=⅓" (the pitches P0, P1, and P2=108, 36, and 12 nm) were set, and the microfabrication of the pitches was achieved at two stages. As a result, the good self-assembled pattern was able to be formed even in the case when the self-assembling was performed in the solvent.

Example 4

The example 4 will be explained. In the example 4, as the diblock copolymer (1), PDMS-polyepoxypropyl methacrylate was used. Further, as the functional material, a trimethoxysilane coupling agent having an amino group to cross-link epoxy was used. Further, for forming the self-assembled layer 14, a solvent (toluene) was used.

With the trimethoxysilane coupling agent having an amino group, the substrate 11 made of silicon was processed. In this manner, the functional layer 12 with an amino group existing on the surface of the substrate 11 was formed.

Thereafter, by the method described in the example 1, the functional layer 12 having the openings 121 hexagonally disposed therein with the pitch P0 (=108 nm) (the prepattern) was obtained.

A self-assembling material of PDMS—polyepoxypropyl methacrylate (Mn: 45000, PDMS: 12000, polyepoxypropyl methacrylate: 33000) was applied on the substrate 11 to be processed in a solvent atmosphere of toluene for two hours. As a result, the self-assembled layer 14 having the second domains 14b arrayed with the pitch P1 (=36 nm) was able to be obtained.

The self-assembled layer 14 was heated at 150° C. for five hours to thereby cross-link an amino group in the functional layer 12 with an epoxy group in the diblock copolymer. Thereafter, the self-assembled layer 14 was washed with PGMEA to remove PDMS-polyepoxypropyl methacrylate that did not cross-link react with the functional layer 12.

PS-PDMS (Mn 14000 (PS: 11000 and PDMS: 3000)) was applied on the self-assembled layer 14 left remaining in this manner to be annealed in vacuum at 160° C. for 12 hours (formation of the self-assembled layer 16).

An obtained phase separation pattern (the self-assembled layers 14 and 16) was/were etched by $CF_4$ gas and oxygen gas, and thereby a PDMS dot pattern with the pitch P2 (=18 nm) was obtained (formation of the self-assembled pattern). The hexagonally packed ratio of PDMS dot in an area 400 nm in side length where dot positions were observed by an AFM was 100%.

As described above, in the example 4, "P1/P0=⅓" and "P2/P1=½" (the pitches P0, P1, and P2=108, 36, and 18 nm) were set, and the microfabrication of the pitches was achieved at two stages. As a result, the good self-assembled pattern was able to be formed even though the constituent material of the self-assembled layer 14 and the constituent material of the self-assembled layer 16 were different.

Example 5

The example 5 will be explained. In the example 5, the lamellar-shaped self-assembled layers 14 and 16 were formed sequentially.

Similarly to the example 1, the functional layer 12 with a benzophenone group existing on the surface of the substrate 11 was formed.

A photoresist for ArF was applied on the functional layer 12, and the resist layer 13 having line-shaped openings 131a each having the width D (=40 nm) disposed therein with the pitch P0 (=160 nm) was formed by an ArF excimer stepper.

By an oxygen RIE device, the functional layer 12 corresponding to line portions (the openings 131a) of the resist layer 13 was removed, and then the substrate 11 was washed with PGMEA to remove the resist layer 13. As a result, the functional layer 12 having a line pattern with the pitch P0 (=160 nm) (the prepattern) was obtained.

A 3% PGMEA solution of PS-PMMA having Mn: 240000 (PS: 130000 and PMMA: 110000) was applied on the patterned functional layer 12 to be annealed at 220° C. for 20 hours. As a result, the self-assembled layer 14 having the second domains 14b linearly arrayed with the pitch P1 (=80 nm) was able to be obtained.

The self-assembled layer 14 was exposed to an ultra-high pressure mercury lamp for 10 minutes to cross-link benzophenone in the functional layer 12 with PS-PMMA. Thereafter, the self-assembled layer 14 was washed with PGMEA to remove PS-PMMA (Mn: 240000) that did not cross-link react with the functional layer 12.

A 2% PGMEA solution of PS-PMMA having Mn: 82000 (PS: 47000 and PMMA: 35000) was applied on the self-assembled layer 14 left remaining in this manner to be annealed at 180° C. for 20 hours (formation of the self-assembled layer 16).

An obtained phase separation pattern (the self-assembled layers 14 and 16) was/were etched by oxygen gas, and thereby a pattern with PS lines arrayed parallel to each other with the pitch P2 (=40 nm) was obtained (formation of the self-assembled pattern).

As described above, in the example 5, "P1/P0=½" and "P2/P1=½" (the pitches P0, P1, and P2=160, 80, and 40 nm) were set, and the microfabrication of the pitches was achieved at two stages. As a result, the line-shaped and good self-assembled pattern was able to be formed.

Example 6

The example 6 will be explained. In the example 6, the cylindrically vertically-oriented self-assembled layers 14 and 16 were formed sequentially.

By the method described in the example 1, the functional layer 12 having the openings 121 hexagonally disposed therein with the pitch P0 (=144 nm) (the prepattern) was obtained.

A 2% PGMEA solution of PS-PMMA having Mn 109000 (PS: 80000 and PMMA: 29000) was applied on the patterned functional layer 12 to be annealed at 200° C. for five hours. As a result, the self-assembled layer 14 having the second domains 14b in which cylinders were vertically oriented hexagonally with the pitch P1 (=48 nm) was able to be obtained.

The self-assembled layer 14 was exposed to an ultra-high pressure mercury lamp for 10 minutes to cross-link benzophenone in the functional layer 12 with PS-PMMA. Thereafter, the substrate 11 was washed with PGMEA to remove PS-PMMA (Mn: 109000) that did not cross-link react with the functional layer 12.

A 1.5% PGMEA solution of PS-PMMA having Mn 41000 (PS: 30000 and PMMA: 11000) was applied on the self-assembled layer 14 left remaining in this manner to be annealed at 170° C. for five hours (formation of the self-assembled layer 16).

An obtained phase separation pattern (the self-assembled layers 14 and 16) was/were etched by oxygen gas, and thereby a hole pattern with the pitch P2 (=24 nm) was obtained (formation of the self-assembled pattern). The percentage of holes disposed on the pre-patterned holes in an area 400 nm in side length where hole positions were observed by an AFM was 100%.

As described above, in the example 6, "P1/P0=⅓" and "P2/P1=½" (the pitches P0, P1, and P2=144, 48, and 24 nm) were set, and the microfabrication of the pitches was achieved at two stages. As a result, the good self-assembled pattern was able to be formed.

Example 7

The example 7 will be explained. In the example 7, the cylindrical and spherical self-assembled layers 14 and 16 were sequentially formed.

By the method described in the example 1, the functional layer 12 having the openings 121 hexagonally disposed therein with the pitch P0 (=108 nm) (the prepattern) was obtained.

A 2% PGMEA solution of PS-PDMS having Mn 45000 (PS: 33000 and PDMS: 12000) was applied on the patterned functional layer 12 to be exposed to a solvent atmosphere of N-methyl pyrrolidinone for two hours. As a result, the self-assembled layer 14 having the second domains 14b in which cylinders were vertically oriented hexagonally with the pitch P1 (=36 nm) was able to be obtained.

The self-assembled layer 14 was exposed to an ultra-high pressure mercury lamp for 10 minutes to cross-link benzophenone in the functional layer 12 with PS-PDMS. Thereafter, the substrate 11 was washed with PGMEA to remove PS-PDMS (Mn: 37500) that did not cross-link react with the functional layer 12.

A 0.7% PGMEA solution of PS-PDMS having Mn 8500 (PS: 7000 and PDMS: 1500) was applied on the self-assembled layer 14 left remaining in this manner to be exposed to the solvent atmosphere of N-methyl pyrrolidinone for two hours (formation of the self-assembled layer 16).

An obtained phase separation pattern (the self-assembled layers 14 and 16) was/were etched by $CF_4$ gas and oxygen gas, and thereby a PDMS dot pattern with the pitch P2 (=12 nm) was obtained (formation of the self-assembled pattern). The hexagonally packed ratio of PDMS dot in an area 400 nm in side length where dot positions were observed by an AFM was 100%.

As described above, in the example 7, "P1/P0=⅓" and "P2/P1=⅓" (the pitches P0, P1, and P2=108, 36, and 12 nm) were set, and the microfabrication of the pitches was achieved at two stages. As a result, the good self-assembled pattern was able to be formed even though the combination of the self-assembled layers 14 and 16 includes a cylinder and a sphere.

Comparative Example

A comparative example will be explained.

Here, as the functional material, polystyrene having molecular weight of 4000 and having a hydrogen group at the end was used. That is, polystyrene having a hydrogen group was applied on the substrate 11 made of silicon and the substrate 11 was spin coated with polystyrene having a hydrogen group. Thereafter, the substrate 11 was annealed in vacuum at 170° C. for 12 hours and then was washed with PGMEA. In this manner, a polystyrene brush film (a functional layer) was formed on the surface of the substrate 11.

On the formed polystyrene brush film, a positive electron beam resist (ZEP) was applied to be drawn•developed by an electron beam. As a result, a resist layer having openings (holes)) hexagonally disposed therein with a pitch 0 (=108 nm) was formed.

By an oxygen RIE (reactive ion etching) device, the polystyrene brush film corresponding to hole portions of the polystyrene brush film was removed. Thereafter, the substrate 11 was washed with PGMEA to thereby remove excessive polystyrene that was not anchored to the substrate 11. As a result, the polystyrene brush film (the functional layer) having the openings (holes) hexagonally disposed therein with the pitch P0 (=108 nm) was formed (formation of a prepattern).

A 0.7% PGMEA solution of PS-PDMS having Mn 8500 (PS: 7000 and PDMS: 1500) was applied on the polystyrene brush film having had a hexagonal dot pattern formed thereon to be annealed at 100° C. for five hours (formation of a self-assembled layer).

An obtained phase separation pattern was etched by $CF_4$ gas and oxygen gas, and thereby a PDMS dot pattern with a pitch P1x (=12 nm) was obtained (formation of a self-assembled pattern). The percentage of dots disposed on the PDMS dot pattern in an area 400 nm in side length where dot positions were observed by an AFM was 60%.

As described above, in the comparative example, "P1x/P0=⅑" (the pitches P0 and P1x=108 and 12 nm) was set, and the microfabrication of the pitches was achieved at one stage. As a result, as compared with the examples 1 to 7, there was irregularity in part of the array of the self-assembled pattern.

In the comparative example, the ratio of the pitches (P1x/P0) is relatively small (P1x/P0=⅑), so that a relatively large number of second domains (dots) (eight second domains (dots)) are disposed between the plural openings in the polystyrene brush film. For this reason, it is conceivable that the proportion of the second domains (dots) that were not directly regulated by the openings (the prepattern) in terms of the disposition was increased relatively, and irregularity was caused in part of the array of the second domains (dots).

In contrast to this, in the examples 1 to 7, it is conceivable that the microfabrication of the pitch P2 corresponding to the pitch P1x in the comparative example was achieved at two stages, so that the array of the fourth domains (dots) was good.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
   forming a functional layer including a functional group to cross-link a first polymer on a substrate;
   forming a diblock copolymer layer including the first polymer and a second polymer on the functional layer;
   self-assembling the diblock copolymer layer to form a self-assembled layer, the self-assembled layer including a first domain corresponding to the first polymer, and a plurality of second domains corresponding to the second polymer, the second domains being surrounded by the first domain or interposed in the first domain;

cross-linking the first polymer in the self-assembled layer with the functional group in the functional layer to divide the self-assembled layer into a lower layer and an upper layer covering the lower layer, the lower layer being bonded to the functional layer and the upper layer being not bonded to the functional layer; and washing or etching the self-assembled layer to remove the upper layer and leave the lower layer.

2. The method of claim 1, further comprising:

forming a second diblock copolymer layer on the lower layer.

3. The method of claim 2, wherein the second diblock copolymer layer includes a third polymer having an affinity to the first polymer, and a fourth polymer having an affinity to the second polymer.

4. The method of claim 3, further comprising:

self-assembling the second diblock copolymer layer to form a second self-assembled layer including a third domain and a plurality of fourth domains, the third domain corresponding to the third polymer, the fourth domains corresponding to the fourth polymer and being surrounded by the third domain, the second self-assembled layer having a self-assembled microdomain dimension equal to or smaller than $(1/\sqrt{3})$ times a self-assembled microdomain dimension of the self-assembled layer.

5. The method of claim 4, wherein the fourth domains in the second self-assembled layer are disposed on the second domains and in between the second domains.

6. The method of claim 4, wherein the shape of each of the second domains and the fourth domains is a lamella, a cylinder, or a sphere.

7. The method of claim 6, wherein the shape of each of the second domains and the shape of each of the fourth domains are different from each other.

8. The method of claim 4, wherein the second polymer and the fourth polymer contain silicon or iron.

9. The method of claim 4, wherein, in the forming the self-assembled layer, the diblock copolymer layer self-assembles with heating or exposing to a solvent vapor; and wherein, in the forming the second self-assembled layer, the second diblock copolymer layer self-assembles with heating or exposing to a solvent vapor.

10. The method of claim 4, further comprising:

etching the third domain or the fourth domains in the second self-assembled layer to leave the fourth domains or the third domain;

etching the first domain or the second domains in the bonding layer to leave the second domains or the first domain; and etching the functional layer and the substrate by using the remaining fourth domains or the remaining third domain as a mask, and the remaining second domains or the remaining first domain as a mask.

11. An imprint mold manufacturing method, comprising, forming an imprint mold by using the substrate etched according to the method of claim 10.

12. The method of claim 2, wherein the substrate has an affinity to the second polymer; and wherein the functional layer has an affinity to the first polymer, the pattern forming method further comprising, prior to the forming the diblock copolymer layer, forming a plurality of holes in the functional layer to make dot pattern of the substrate.

* * * * *